United States Patent
Sim et al.

(10) Patent No.: US 12,133,456 B2
(45) Date of Patent: *Oct. 29, 2024

(54) ORGANIC ELECTROLUMINESCENCE DEVICE AND FUSED POLYCYCLIC COMPOUND FOR ORGANIC ELECTROLUMINESCENCE DEVICE

(71) Applicant: SAMSUNG DISPLAY CO., LTD., Yongin-si (KR)

(72) Inventors: Mun-Ki Sim, Seoul (KR); Seokhwan Hwang, Suwon-si (KR); Junha Park, Gwacheon-si (KR); Hankyu Pak, Suwon-si (KR); Chanseok Oh, Seoul (KR); Hyoyoung Lee, Suwon-si (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

This patent is subject to a terminal disclaimer.

(21) Appl. No.: 17/110,108

(22) Filed: Dec. 2, 2020

(65) Prior Publication Data
US 2021/0226126 A1   Jul. 22, 2021

(30) Foreign Application Priority Data
Jan. 17, 2020  (KR) .................. 10-2020-0006535

(51) Int. Cl.
*H10K 85/60*   (2023.01)
*H10K 50/11*   (2023.01)
(Continued)

(52) U.S. Cl.
CPC ......... *H10K 85/633* (2023.02); *H10K 85/636* (2023.02); *H10K 85/657* (2023.02);
(Continued)

(58) Field of Classification Search
CPC ...... C07F 5/02; H01L 51/006; H01L 51/0061; H01L 51/0071; H01L 51/0072;
(Continued)

(56) References Cited

U.S. PATENT DOCUMENTS 6,602,618 B2   8/2003   Watanabe et al.
10,374,166 B2  8/2019   Hatakeyama et al.
(Continued)

FOREIGN PATENT DOCUMENTS

CA   3017002 A1   3/2019
CH   422200 A    10/1966
(Continued)

OTHER PUBLICATIONS

WO-2021230133-A1 machine translation (Year: 2021).*
(Continued)

*Primary Examiner* — Elizabeth M. Dahlburg
(74) *Attorney, Agent, or Firm* — Lewis Roca Rothgerber Christie LLP

(57) ABSTRACT

An organic electroluminescence device includes a first electrode and a second electrode facing each other, and a plurality of organic layers between the first electrode and the second electrode, wherein at least one of the organic layers includes a fused polycyclic compound represented by Formula 1 below, thereby improving luminous efficiency.

(Continued)

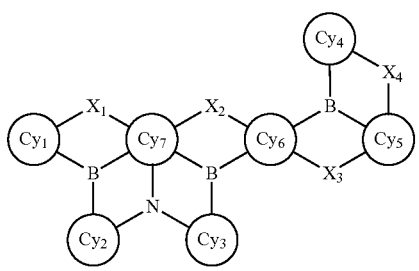

Formula 1

20 Claims, 2 Drawing Sheets

(51) Int. Cl.
   *H10K 85/30* (2023.01)
   *H10K 101/10* (2023.01)
   *H10K 101/20* (2023.01)
(52) U.S. Cl.
   CPC ......... *H10K 85/6572* (2023.02); *H10K 50/11* (2023.02); *H10K 85/322* (2023.02); *H10K 2101/10* (2023.02); *H10K 2101/20* (2023.02)
(58) Field of Classification Search
   CPC ............... H01L 51/008; H01L 51/5012; H01L 51/5024; H01L 51/5056; H01L 51/5072; H10K 85/322; H10K 85/633; H10K 85/636; H10K 85/657; H10K 85/6572; H10K 50/11; H10K 50/12; H10K 50/15; H10K 50/16; H10K 2101/10; H10K 2101/20
   See application file for complete search history.

(56) References Cited

U.S. PATENT DOCUMENTS

| | | | |
|---|---|---|---|
| 10,483,471 B2 | 11/2019 | Ishidai et al. | |
| 2004/0170863 A1 | 9/2004 | Kim et al. | |
| 2007/0059552 A1 | 3/2007 | Takeda et al. | |
| 2015/0236274 A1 | 8/2015 | Hatakeyama et al. | |
| 2016/0351811 A1 | 12/2016 | Lam et al. | |
| 2018/0069182 A1 | 3/2018 | Hatakeyama et al. | |
| 2018/0094000 A1 | 4/2018 | Hatakeyama et al. | |
| 2018/0108857 A1 | 4/2018 | Adachi et al. | |
| 2018/0301629 A1 | 10/2018 | Hatakeyama et al. | |
| 2019/0058124 A1 | 2/2019 | Hatakeyama et al. | |
| 2019/0115538 A1 | 4/2019 | Lim et al. | |
| 2019/0207112 A1 | 7/2019 | Hatakeyama et al. | |
| 2019/0348617 A1 | 11/2019 | Mamada et al. | |
| 2021/0159411 A1* | 5/2021 | Sim | H10K 85/657 |
| 2021/0273174 A1* | 9/2021 | Kuwabara | H10K 85/322 |
| 2021/0305512 A1* | 9/2021 | Suzaki | H10K 85/631 |
| 2021/0376250 A1* | 12/2021 | Suzaki | H10K 85/6576 |

FOREIGN PATENT DOCUMENTS

| | | | |
|---|---|---|---|
| CN | 107417715 A | 12/2017 | |
| JP | 2007-73891 A | 3/2007 | |
| JP | 2012-116784 A | 6/2012 | |
| JP | 5935199 B2 | 6/2016 | |
| JP | 2018043984 A | 3/2018 | |
| KR | 10-2016-0119683 A | 10/2016 | |
| KR | 10-2017-0082447 A | 7/2017 | |
| KR | 10-2017-0130434 A | 11/2017 | |
| KR | 10-2017-0130435 A | 11/2017 | |
| KR | 10-1876763 B1 | 7/2018 | |
| KR | 10-1886773 B1 | 8/2018 | |
| KR | 10-2018-0108604 A | 10/2018 | |
| KR | 10-2018-0122298 A | 11/2018 | |
| KR | 10-2019-0025065 | 3/2019 | |
| KR | 10-1955647 B1 | 3/2019 | |
| KR | 10-1955648 B1 | 3/2019 | |
| KR | 10-2019-0042791 A | 4/2019 | |
| WO | WO 2015/102118 A1 | 7/2015 | |
| WO | WO 2016/152418 A1 | 9/2016 | |
| WO | WO 2016/152544 A1 | 9/2016 | |
| WO | WO 2016/152605 A1 | 9/2016 | |
| WO | WO 2017/138526 A1 | 8/2017 | |
| WO | WO 2017/188111 A1 | 11/2017 | |
| WO | WO 2018/212169 A1 | 11/2018 | |
| WO | WO 2019/052940 A1 | 3/2019 | |
| WO | WO 2018/212169 A1 | 3/2020 | |
| WO | WO-2021230133 A1 * | 11/2021 | |
| WO | WO-2022096495 A1 * | 5/2022 | |

OTHER PUBLICATIONS

U.S. Advisory Action dated May 31, 2022, issued in U.S. Appl. No. 16/523,168 (3 pages).
Agou, T., et al. "Syntheses, Structure, and Optical Properties of Ladder-Type Fused Azaborines," Organic Letters 8(11), 2006, pp. 2241-2244.
Chinese Office Action dated Mar. 17, 2023 for CN Appl. No. 201910694080.8, 11 pages.
Office Action for U.S. Appl. No. 16/523,168 dated Feb. 16, 2023, 10 pages.
Office Action for U.S. Appl. No. 17/002,617 dated Mar. 17, 2023, 6 pages.
Zhang, J., et al. "The Ground State Spin Multiplicity of Schlenk-type Biradicals and the Influence of Additional Linkage to Ladder Type Structures" Chemical Physics 206, 1996, pp. 339-351.
Final Office Action for U.S. Appl. No. 16/523,168 dated Mar. 28, 2022, 24 pages.
Restriction Requirement for U.S. Appl. No. 16/523,168 dated Aug. 16, 2021, 8 pages.
Anton Pershin, et al., "Highly emissive excitons with reduced exchange energy in thermally activated delayed fluorescent molecules," Nature Communications, vol. 10, No. 597, (2019), pp. 1-5.
Chibani et al., "Excited States of Ladder-Type π-Conjugated Dyes with a Joint SOS-CIS(D) and PCM-TD-OFT Approach," J. Phys. Chem. A. 119—pp. 5417-5425. 2015 (Year: 2015).
Wang et al., "Synthesis of Di- and Trixanthones that Display High Stability and a Visual Fluorescence Response to Strong Acid," Chem. Asian J. 9—pp. 3307-3312. 2014 (Year: 2014).
U.S. Office Action dated Dec. 21, 2021, issued in U.S. Appl. No. 16/523,168 (25 pages).
Agou, et. al., "Electronic and Optical Properties of Ladder-type Heteraborins," Chem. Eur. J. (2007), pp. 8051-8060.
Colquhoun, et al., "Synthesis of Dixanthones and Poly(dixanthone)s by Cyclization of 2-Aryloxybenzonitriles in Trifluoromethanesulfonic Acid," Org Lett. (2001), vol. 3, No. 15, pp. 2337-2340.
Office Action dated Nov. 30, 2023 for U.S. Appl. No. 16/523,168, 7 pages.
U.S. Notice of Allowance dated Jul. 19, 2023, issued in U.S. Appl. No. 17/002,617 (8 pages).
U.S. Final Office Action dated Jul. 7, 2023, issued in U.S. Appl. No. 16/523,168 (10 pages).
Final Office Action for U.S. Appl. No. 16/523,168 dated Mar. 7, 2024, 7 pages.
Office Action for U.S. Appl. No. 16/780,744 dated Feb. 1, 2024, 8 pages.
US Final Office Action dated Jun. 18, 2024, issued in U.S. Appl. No. 16/780,744 (9 pages).
US Office Action dated Jul. 12, 2024, issued in U.S. Appl. No. 16/523,168 (8 pages).

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0006535, filed on Jan. 17, 2020, the entire contents of which are incorporated herein by reference.

BACKGROUND

1. Field

Embodiments of the present disclosure herein relate to an organic electroluminescence device and a fused polycyclic compound used therein, and, for example, to a fused polycyclic compound used as a light emitting material and an organic electroluminescence device including the same.

2. Related Art

Recently, the development of an organic electroluminescence display as an image display apparatus is being actively conducted. Unlike liquid crystal displays and the like, the organic electroluminescence display is a so-called self-luminescent display apparatus in which holes and electrons injected from a first electrode and a second electrode recombine in an emission layer, and thus a luminescent material including an organic compound in the emission layer emits light to implement display.

In the application of an organic electroluminescence device to a display apparatus, there is a demand for an organic electroluminescence device having a low driving voltage, high luminous efficiency, and a long life, and development on materials, for an organic electroluminescence device, capable of stably providing such characteristics are being investigated.

In recent years, particularly in order to implement a highly efficient organic electroluminescence device, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using a delayed fluorescence phenomenon are being developed.

SUMMARY

Embodiments of the present disclosure provide an organic electroluminescence device having improved luminous efficiency.

Embodiments of the present disclosure also provide a fused polycyclic compound capable of improving luminous efficiency of an organic electroluminescence device.

An embodiment of the present disclosure provides an organic electroluminescence device including a first electrode, a second electrode facing the first electrode, and a plurality of organic layers between the first electrode and the second electrode, wherein at least one of the organic layers includes a fused polycyclic compound represented by Formula 1 below.

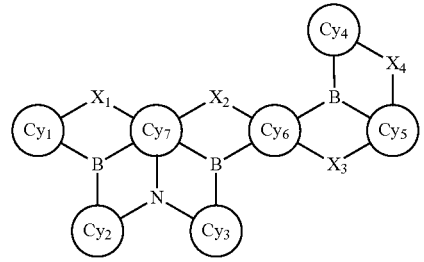

Formula 1

In Formula 1 above, $Cy_1$ to $Cy_7$ are each independently a substituted or unsubstituted aromatic hydrocarbon ring, or a substituted or unsubstituted aromatic heterocycle, $X_1$ to $X_4$ are each independently $NR_a$, O, or S, and $R_a$ is a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms.

The organic layers may include a hole transport region on the first electrode, an emission layer on the hole transport region, and an electron transport region on the emission layer, and the emission layer may include the fused polycyclic compound represented by Formula 1 above.

The emission layer may emit delayed fluorescence.

The emission layer is a delayed fluorescence emission layer including a host and a dopant, and the dopant may include the fused polycyclic compound represented by Formula 1 above.

The emission layer may include a host having a lowest triplet excitation energy level, a first dopant having a lowest triplet excitation energy level lower than the lowest triplet excitation energy level of the host, and a second dopant having a lowest triplet excitation energy level lower than the lowest triplet excitation energy level of the first dopant, and the first dopant may include the fused polycyclic compound represented by Formula 1 above.

The first dopant may be a delayed fluorescence dopant, and the second dopant may be a fluorescence dopant.

The fused polycyclic compound represented by Formula 1 above may be represented by Formula 2 below.

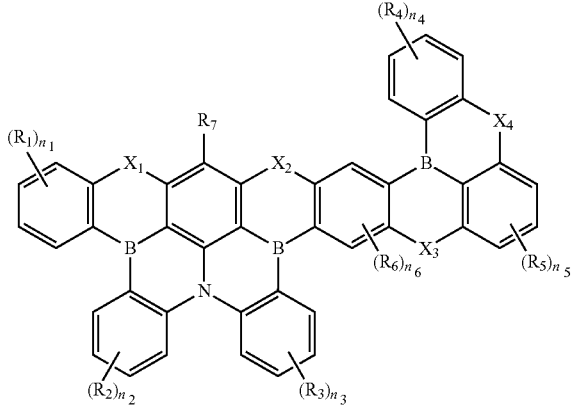

Formula 2

In Formula 2 above, $R_1$ to $R_7$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 ring-forming carbon atoms, a substituted or unsubstituted heteroaryl group having 1 to 60 ring-forming carbon atoms, or bonded to an adjacent group to form a ring, $n_1$ to $n_4$ are each independently an integer of 0 to 4, $n_5$ is an integer of 0 to 3, and $n_6$ is an integer of 0 to 2.

In Formula 2 above, $X_1$ to $X_4$ may have the same description as provided with respect to Formula 1 above.

The fused polycyclic compound represented by Formula 1 above may be represented by Formula 3 below.

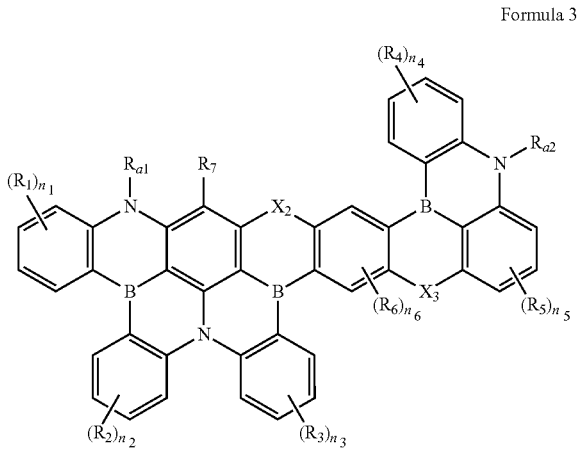

Formula 3

In Formula 3 above, $R_{a1}$ and $R_{a2}$ are each independently a substituted or unsubstituted aryl group having 6 to 60 ring-forming carbon atoms, or a substituted or unsubstituted heteroaryl group having 1 to 60 ring-forming carbon atoms.

In Formula 3 above, $X_2$, $X_3$, $R_1$ to $R_7$, and $n_1$ to $n_6$ may have the same description as provided with respect to Formulas 1 and 2 above.

The fused polycyclic compound represented by Formula 1 above may be represented by Formula 4 below.

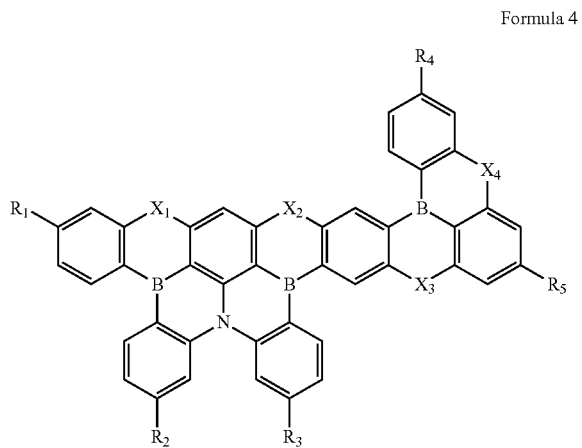

Formula 4

In Formula 4 above, $X_1$ to $X_4$, $R_1$ to $R_5$ may have the same description as provided with respect to Formulas 1 and 2 above.

In Formula 4 above, $R_1$ to $R_5$ may be each independently a substituted or unsubstituted amine group, or a substituted or unsubstituted carbazole group.

In Formula 1 above, when $X_1$ to $X_4$ are each independently $NR_a$, $R_a$ may be a substituted or unsubstituted phenyl group.

In an embodiment, the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides of one or more thereof.

The fused polycyclic compound according to an embodiment of the present disclosure may be represented by Formula 1 above.

A difference between the lowest singlet excitation energy level (S1) and the lowest triplet excitation energy level (T1) of the fused polycyclic compound represented by Formula 1 above may be an absolute value of 0.33 eV or less for.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
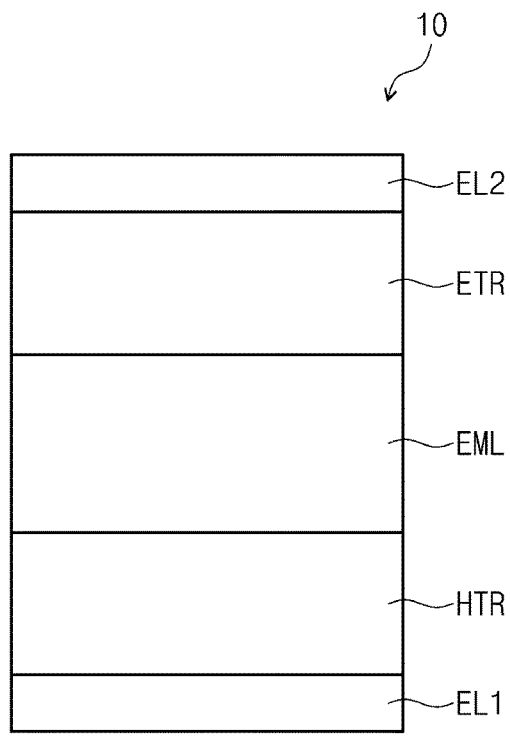
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element or layer is referred to as being "on", "connected to" or "coupled to" another element or layer, it can be directly on, connected or coupled to the other element or layer or intervening elements or layers may be present.

Like numbers refer to like elements throughout. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure will be described with reference to the accompanying drawings.

FIGS. 1 to 4 are cross-sectional views schematically illustrating organic electroluminescence devices according to embodiments of the present disclosure. Referring to FIGS. 1 to 4, in an organic electroluminescence device 10 according to an embodiment, a first electrode EU and a second electrode EL2 face each other, and a plurality of organic layers may be between the first electrode EL1 and the second electrode EL2. The plurality of organic layers may include a hole transport region HTR, an emission layer EML, and an electron transport region ETR. For example, the organic electroluminescence device 10 according to an embodiment may include the first electrode EL1, the hole transport region HTR, the emission layer EML, the electron transport region ETR, and the second electrode EL2 that are sequentially stacked. A capping layer CPL may be further on the second electrode EL2.

The organic electroluminescence device 10 of an embodiment may include a fused polycyclic compound of an embodiment, which will be further described herein below, in at least one of the plurality of organic layers between the first electrode EL1 and the second electrode EL2. For example, the organic electroluminescence device 10 of an embodiment may include a fused polycyclic compound of an embodiment, which will be described in more detail herein below, in the emission layer EML between the first electrode EU and the second electrode EL2. However, embodiments of the present disclosure are not limited thereto, and the organic electroluminescence device 10 of an embodiment may include a fused polycyclic compound according to an embodiment, which will be further described herein below, not only in the emission layer EML but also in at least one organic layer included in the hole transport region HTR and electron transport region ETR, which are a plurality of organic layers between the first electrode EU and the second electrode EL2, or in the capping layer CPL on the second electrode EL2.

Figure 2:
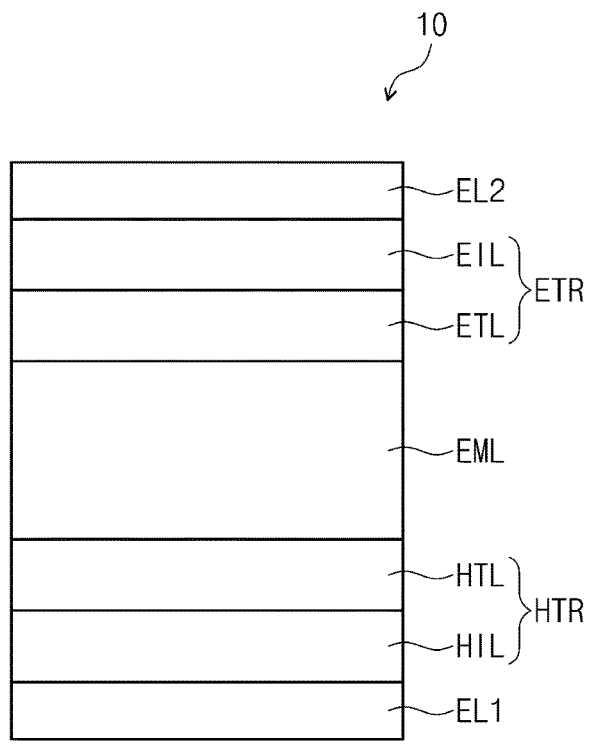
FIG. 2 is a cross-sectional view schematically illustrating an organic electroluminescence device according to an embodiment of the present disclosure.
Figure 3:
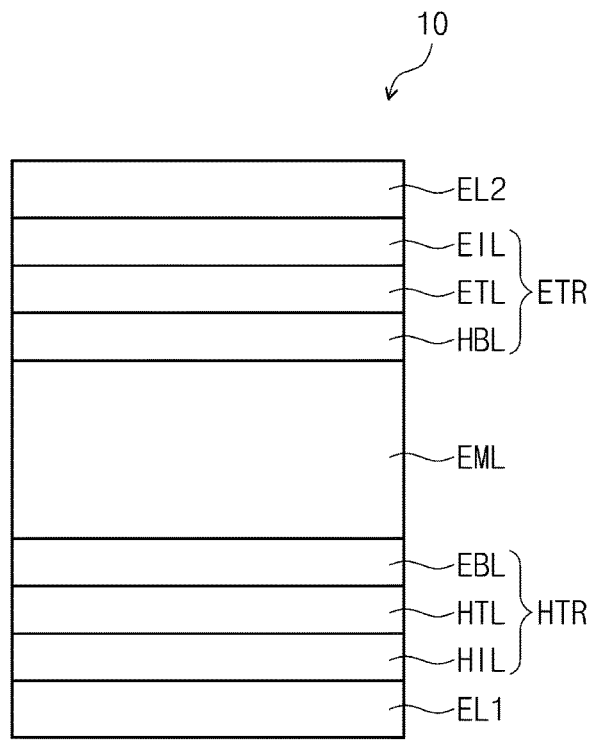
FIG. 3 is a cross-sectional view schematically illustrating an organic electroluminescence device according to an embodiment of the present disclosure.
Figure 4:
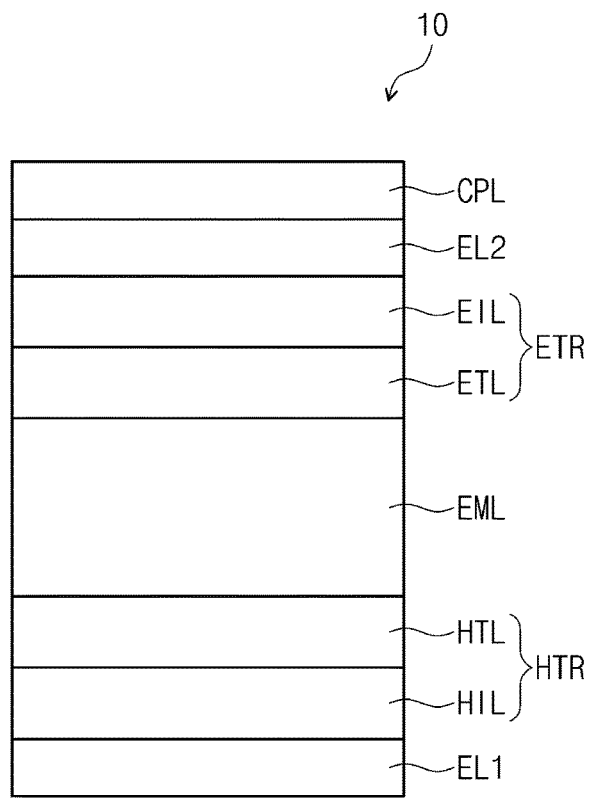
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. In addition, compared to FIG. 1, FIG. 3 illustrates a cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 2, FIG. 4 illustrates a cross-sectional view of an organic electroluminescence device 10 of an embodiment including a capping layer CPL on the second electrode EL2.

Hereinafter, the description of the organic electroluminescence device 10 of an embodiment will include a fused polycyclic compound according to an embodiment, which will be further described herein below, in the emission layer EML, but embodiments of the present disclosure are not limited thereto, and the fused polycyclic compound according to an embodiment, which will be further described herein below, may be included in hole transport region HTR, the electron transport region ETR, or the capping layer CPL.

The first electrode EL1 has conductivity. The first electrode EU may be formed of a metal alloy and/or a conductive compound. The first electrode EU may be an anode. In addition, the first electrode EU may be a pixel electrode. The first electrode EU may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EU is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and/or oxides of one or more thereof. The first electrode EL1 may include Ag, Mg, Cu, Al, Pt, Pd, Au, Ni, Nd, Ir, Cr, Li, Ca, LiF/Ca, LiF/Al, Mo, Ti, a compound thereof, and/or a mixture thereof (e.g., a mixture of Ag and Mg). In some embodiments, the first electrode EU may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The thickness of the first electrode EU may be from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL. The thickness of the hole transport region HTR may be, for example, from about 50 Å to about 1,500 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments of the present disclosure are not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without a substantial increase in driving voltage.

The hole transport region HTR may further include, in addition to the above-described materials, a charge generating material to increase conductivity (e.g., electrical conductivity). The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, etc., but is not limited thereto.

As described above, the hole transport region HTR may further include at least one of a hole buffer layer or an electron blocking layer EBL in addition to the hole injection layer HIL and the hole transport layer HTL. The hole buffer layer, may compensate a resonance distance according to the wavelength of light emitted from an emission layer EML and may increase light emission efficiency. Materials which may be included in the hole transport region HTR may be used as materials which may be included in the hole buffer layer. The electron blocking layer EBL is a layer that serves to prevent or reduce injection of electrons from the electron transport region ETR to the hole transport region HTR.

The emission layer EML is provided on the hole transport region HTR. The thickness of the emission layer EML may be, for example, from about 100 Å to about 1000 Å or from about 100 Å to about 300 Å. The emission layer EML may have a single layer formed of a single material, a single layer formed of a plurality of different materials, or a multilayer structure having a plurality of layers formed of a plurality of different materials.

In the organic electroluminescence device 10 of an embodiment, the emission layer EML may include a fused polycyclic compound of an embodiment.

In the description, the term "substituted or unsubstituted" may indicate that one is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or a phenyl group substituted with a phenyl group.

In the present description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. Rings formed by being bonded to an adjacent group may be monocyclic or polycyclic. In addition, the rings formed by being bonded to each other may be coupled to another ring to form a spiro structure.

In the present description, the term "an adjacent group" may mean a substituent substituted for an atom which is directly coupled to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups".

In the present description, examples of a halogen atom may include a fluorine atom, a chlorine atom, a bromine atom, and an iodine atom.

In the present description, an alkyl group may be a linear, branched or cyclic type (e.g., a linear, branched, or cyclic alkyl group). The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the present description, an alkenyl group means a hydrocarbon group including at least one carbon double bond in the middle or end of an alkyl group having 2 or more carbon atoms. The alkenyl group may be linear or branched. Although the number of carbon atoms is not specifically limited, it may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

In the description, an alkynyl group may be a hydrocarbon group including at least one carbon triple bond at a main chain (e.g., in the middle) or end (e.g., a terminal end) of an alkyl group having 2 or more carbon atoms. The alkynyl group may be linear or branched. Although the number of carbon atoms is not specifically limited, it may be 2 to 30, 2 to 20, or 2 to 10. Examples of the alkynyl group may include an ethynyl group, a propynyl group, etc., but are not limited thereto.

In the present description, a hydrocarbon ring may be any functional group or substituent derived from an aliphatic hydrocarbon ring, or any functional group or substituent derived from an aromatic hydrocarbon ring. The number of ring-forming carbon atoms in the hydrocarbon ring may be 5 to 60, 5 to 30, or 5 to 20.

In the present description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., but are not limited thereto.

In the present description, a fluorenyl group may be substituted, and two substituents may be bonded to each other to form a spiro structure. An example that the fluorenyl group is substituted is as follows. However, embodiments of the present disclosure are not limited thereto.

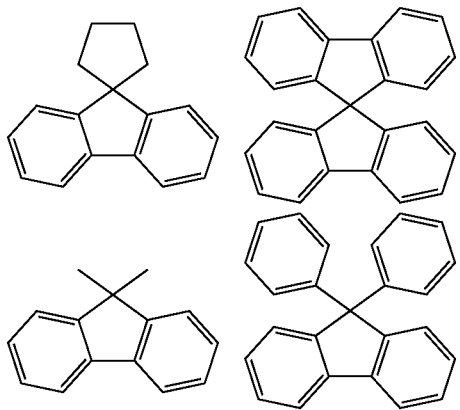

In the present description, a heterocyclic group may be any functional group or substituent derived from a ring containing at least one of B, O, N, P, Si, or S as a hetero atom. The heterocyclic group includes an aliphatic heterocyclic group and an aromatic heterocyclic group. The aromatic heterocyclic group may be a heteroaryl group. The aliphatic heterocycle and aromatic heterocycle may be monocyclic or polycyclic.

In the present description, the heterocyclic group may include at least one of B, O, N, P, Si or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and include a heteroaryl group. The number of ring-forming carbon atoms in in the heterocyclic group may be 1 to 60, 2 to 30, 2 to 20, or 2 to 10.

In the present description, an aliphatic heterocyclic group may include at least one of B, O, N, P, Si, or S as a hetero atom. The number of ring-forming carbon atoms in the aliphatic heterocyclic group may be 2 to 60, 2 to 30, 2 to 20, or 2 to 10. Examples of the aliphatic heterocyclic group include an oxirane group, a tyran group, a pyrrolidine group, a piperidine group, a tetrahydrofuran group, a tetrahydrothiophene group, a thian group, a tetrahydropyran group, a 1,4-dioxane group, etc., but are not limited to thereto.

In the present description, a heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 1 to 60, 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a pyrazine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the present description, the above description of the aryl group may be applied to an arylene group, except that the arylene group is a divalent group. The above description of the heteroaryl group may be applied to a heteroarylene group, except that the heteroarylene group is a divalent group.

In the present description, a silyl group includes an alkyl silyl group and an aryl silyl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the present description, a boryl group includes an alkyl boryl group and an aryl boryl group. Examples of the boryl group include a trimethylboryl group, a triethylboryl group, a t-butyldimethylboryl group, a triphenylboryl group, a diphenylboryl group, a phenylboryl group, etc., but are not limited to.

In the present description, the number of carbon atoms in an amine group is not particularly limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

In the present description, an oxy group may include an alkoxy group and/or an aryl oxy group. The alkoxy group may be a linear, branched or cyclic chain. The number of carbon atoms in the alkoxy group may be, for example, 1 to 20, or 1 to 10, but is not particularly limited thereto. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the present description, the alkyl group in the alkyl thio group, the alkyl sulfoxy group, the alkyl aryl group, the alkyl amine group, the alkyl boryl group, and the alkyl silyl group is the same as the above-described examples of the alkyl group.

In the present description, the aryl group in the aryl oxy group, the aryl thio group, the aryl sulfoxy group, the aryl amine group, the aryl boryl group, and the aryl silyl group is the same as the above-described examples of the aryl group.

In the present description, a direct linkage may refer to a single linkage (e.g., a single bond).

The fused polycyclic compound of an embodiment may include three boron atoms and include a structure in which seven aromatic rings are fused with (combined together with) the three boron atoms therebetween. The fused polycyclic compound of an embodiment may include a structure in which three aromatic rings are coupled to each of the three boron atoms, and two boron atoms are coupled to one aromatic ring. The fused polycyclic compound of an embodiment includes a structure in which seven aromatic rings are coupled via three boron atoms and five hetero atoms, and at least one of the five hetero atoms may be a nitrogen atom.

The fused polycyclic compound of an embodiment may be represented by Formula 1 below.

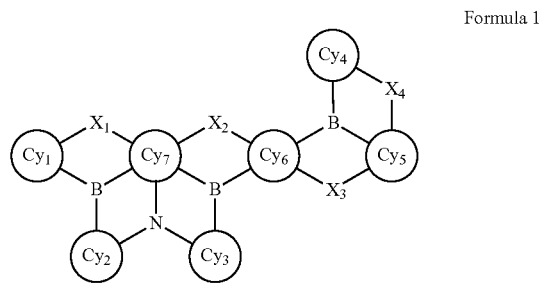

Formula 1

In Formula 1, $Cy_1$ to $Cy_7$ are each independently a substituted or unsubstituted aromatic hydrocarbon ring, or a substituted or unsubstituted aromatic heterocycle. $Cy_1$ to $Cy_7$ may be each independently a substituted or unsubstituted 5- or 6-membered aromatic hydrocarbon ring, or a substituted or unsubstituted 5- or 6-membered aromatic heterocycle. In an embodiment, $Cy_1$ to $Cy_7$ may be each independently a substituted or unsubstituted benzene ring, or a substituted or unsubstituted pyridine ring.

In Formula 1, $X_1$ to $X_4$ may be each independently $NR_a$, O, or S. $X_1$ to $X_4$ may be the same as or different from each other. In an embodiment, $X_1$ to $X_4$ all may be O, S, or $NR_a$. In some embodiments, one of $X_1$ to $X_4$ may be $NR_a$, and the other three may be O or S. In some embodiments, two of $X_1$ to $X_4$ may be $NR_a$, and the other two may be O or S. In some embodiments, three of $X_1$ to $X_4$ may be $NR_a$, and the other may be O or S.

In Formula 1, $R_a$ is a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms. $R_a$ may be a substituted or unsubstituted aryl group having 6 to 30 ring-forming carbon atoms, or a substituted or unsubstituted heteroaryl group having 2 to 30 ring-forming carbon atoms. In an embodiment, $R_a$ may be a substituted or unsubstituted phenyl group, a substituted or unsubstituted pyridine group, a substituted or unsubstituted pyrimidine group, a substituted or unsubstituted pyrazine group, or a substituted or unsubstituted triazine group.

Compared to an existing polycyclic compound including a nitrogen atom and a boron atom in the core, the fused polycyclic compound of an embodiment includes three boron atoms, and a structure in which seven aromatic rings are coupled via three boron atoms and five hetero atoms to have a multiple resonance structure having a wide plate-like frame. Accordingly, the fused polycyclic compound of an embodiment includes three boron atoms and exhibits multiple resonances in the wide plate-like frame to easily separate HOMO and LUMO states in one molecule, thereby being applicable as or suitable to be a delayed fluorescence emission material. The fused polycyclic compound of an embodiment may have a decrease in a difference ($\Delta E_{st}$) between a lowest triplet excitation energy level (T1 level) and a lowest singlet excitation energy level (S1 level) due to the above-described structure, and accordingly when used as a delayed fluorescence emission material, luminous efficiency of an organic electroluminescence device may be improved.

The fused polycyclic compound represented by Formula 1 may be represented by Formula 2 below.

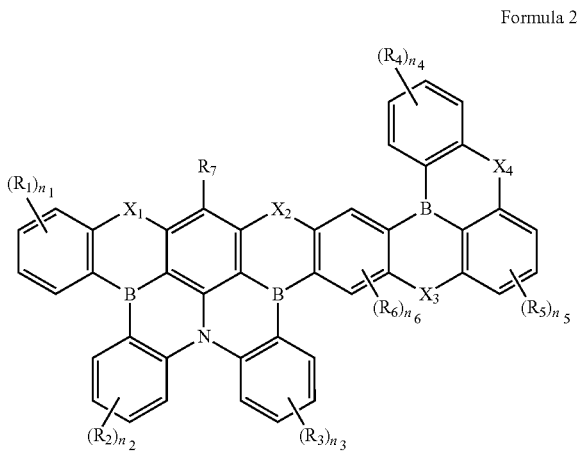

Formula 2

Formula 2 may be a case where $Cy_1$ to $Cy_7$ are specified as a substituted or unsubstituted benzene ring in Formula 1.

In Formula 2, $R_1$ to $R_7$ may be each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms, or bonded to an adjacent group to form a ring. $R_1$ to $R_7$ may be each independently a hydrogen atom, a deuterium atom, a halogen atom, a substituted or unsubstituted aryl amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms. In an embodiment, $R_1$ to $R_7$ may be each independently a hydrogen atom, a substituted or unsubstituted diphenylamine group, or a substituted or unsubstituted carbazole group.

In Formula 2, $n_1$ to $n_4$ are each independently an integer of 0 to 4. When $n_1$ is 0, the fused polycyclic compound of an embodiment may not be substituted with $R_1$. When $n_1$ is 4 and $R_1$ is all hydrogen atoms, the case may be the same as when $n_1$ is 0. When $n_1$ is an integer of 2 or more, a plurality of $R_1$'s all may be the same or at least one of the plurality of $R_1$'s may be different. When $n_2$ is 0, the fused polycyclic compound of an embodiment may not be substituted with $R_2$. When $n_2$ is 4 and $R_2$ is all hydrogen atoms, the case may be the same as when $n_2$ is 0. When $n_2$ is an integer of 2 or more, a plurality of $R_2$'s all may be the same or at least one of the plurality of $R_2$'s may be different. When $n_3$ is 0, the fused polycyclic compound of an embodiment may not be substituted with $R_3$. When $n_3$ is 4 and $R_3$ is all hydrogen atoms, the case may be the same as when $n_3$ is 0. When $n_3$ is an integer of 2 or more, a plurality of $R_3$'s all may be the same or at least one of the plurality of $R_3$'s may be different.

When $n_4$ is 0, the fused polycyclic compound of an embodiment may not be substituted with $R_4$. When $n_4$ is 4 and $R_4$ is all hydrogen atoms, the case may be the same as when $n_4$ is 0. When $n_4$ is an integer of 2 or more, a plurality of $R_4$'s all may be the same or at least one of the plurality of $R_4$'s may be different.

In Formula 2, $n_5$ is an integer of 0 to 3. When $n_5$ is 0, the fused polycyclic compound of an embodiment may not be substituted with $R_5$. When $n_5$ is 3 and $R_5$ is all hydrogen atoms, the case may be the same as when $n_5$ is 0. When $n_5$ is an integer of 2 or more, a plurality of $R_5$'s all may be the same or at least one of the plurality of $R_5$'s may be different.

In Formula 2, $n_6$ is an integer of 0 to 2. When $n_6$ is 0, the fused polycyclic compound of an embodiment may not be substituted with $R_6$. When $n_6$ is 2 and $R_6$ is all hydrogen atoms, the case may be the same as when $n_6$ is 0. When $n_6$ is 2, a plurality of $R_6$'s all may be the same or at least one of the plurality of $R_6$'s may be different.

In Formula 2, $X_1$ to $X_4$ may have the same description as provided with respect to Formula 1 above.

The fused polycyclic compound represented by Formula 1 may be represented by Formula 3 below.

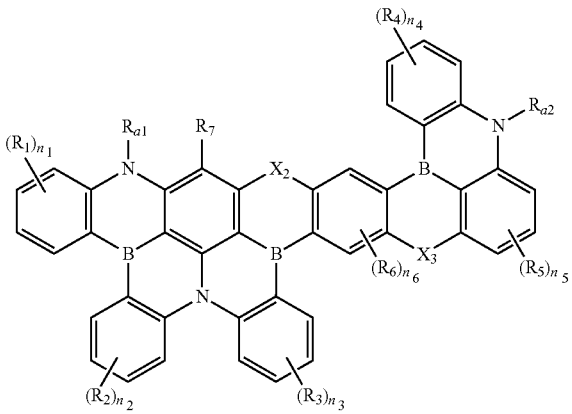

Formula 3

Formula 3 is a case where $X_1$ and $X_4$ are each independently $NR_a$ in Formula 2.

In Formula 3, $R_{a1}$ and $R_{a2}$ are each independently a substituted or unsubstituted aryl group having 6 to 60 ring-forming carbon atoms, or a substituted or unsubstituted heteroaryl group having 1 to 60 ring-forming carbon atoms. In an embodiment, $R_{a1}$ and $R_{a2}$ may be each independently a substituted or unsubstituted phenyl group, or a substituted or unsubstituted pyridine group.

In Formula 3, $X_2$, $X_3$, $R_1$ to $R_7$, and $n_1$ to $n_6$ may have the same description as provided with respect to Formulas 1 and 2 above.

The fused polycyclic compound represented by Formula 1 may be represented by Formula 4 below.

Formula 4

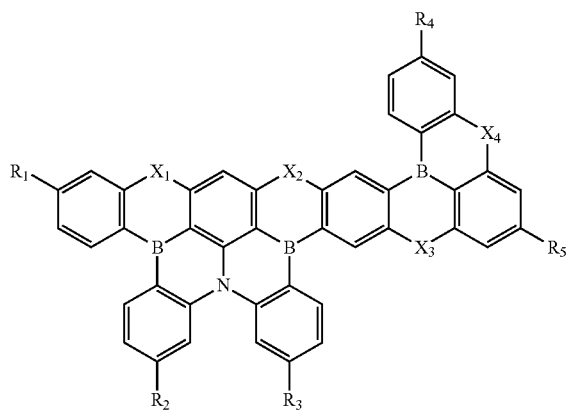

Formula 4 is a case where $n_1$, $n_2$, $n_3$, $n_4$, and $n_5$ are 1 respectively, $n_6$ is 0, substitution positions of $R_1$ to $R_5$ are specified, and $R_7$ is a hydrogen atom in Formula 2.

In Formula 4, $R_1$ to $R_5$ may be each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms. At least one of $R_1$ to $R_5$ may be a substituted or unsubstituted amine group, or a substituted or unsubstituted carbazole group. In an embodiment, at least one of $R_1$ to $R_5$ may be a substituted or unsubstituted diphenylamine group, or a substituted or unsubstituted carbazole group.

In Formula 4, $X_1$ to $X_4$ may have the same description as provide with respect to Formula 1 above.

The fused polycyclic compound of an embodiment may be any one of the compounds represented by Compound Group 1 below. An organic electroluminescence device 10 according to an embodiment may include at least one fused polycyclic compound among the compounds represented by Compound Group 1 in an emission layer EML.

Compound Group 1

1

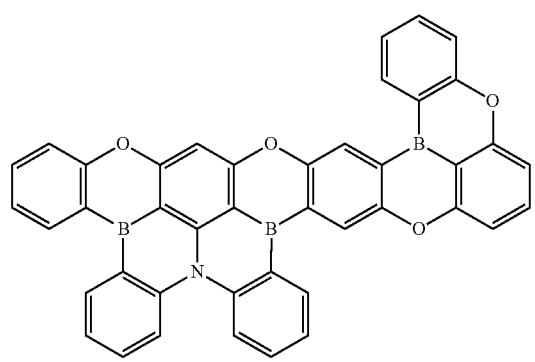

2

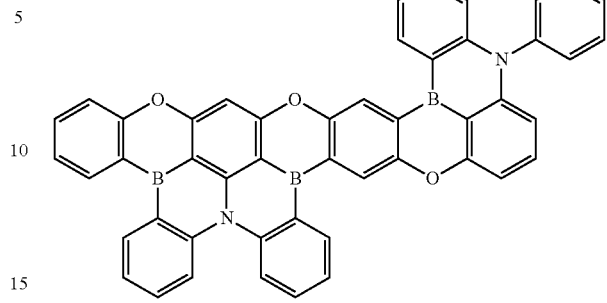

3

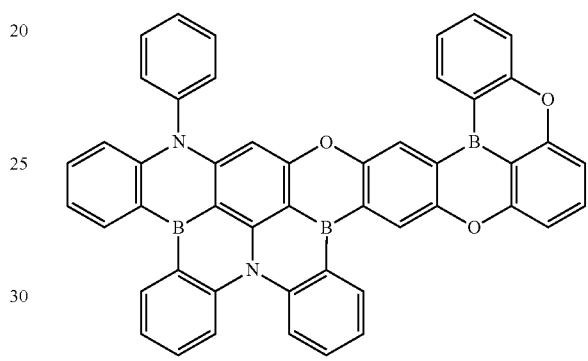

4

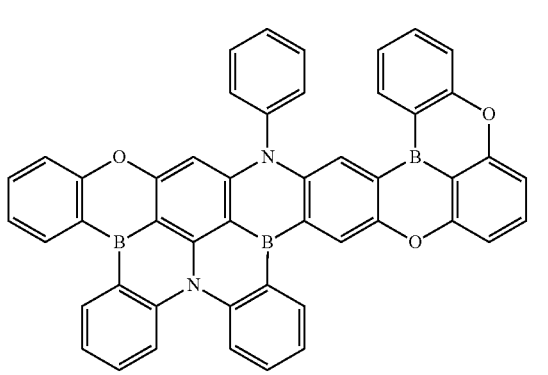

5

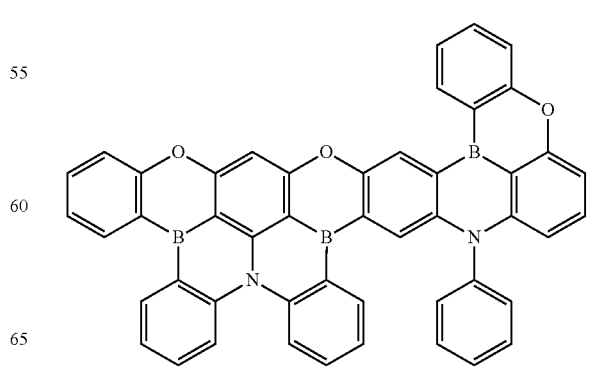

6
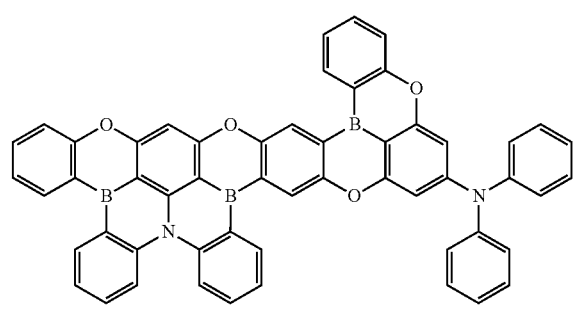
7
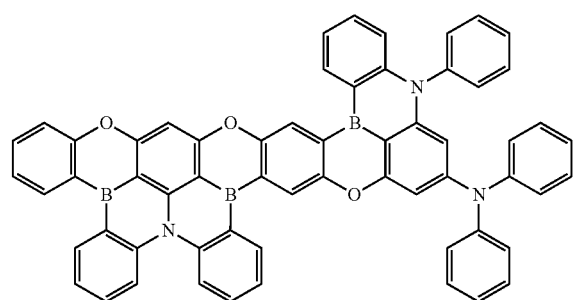
8
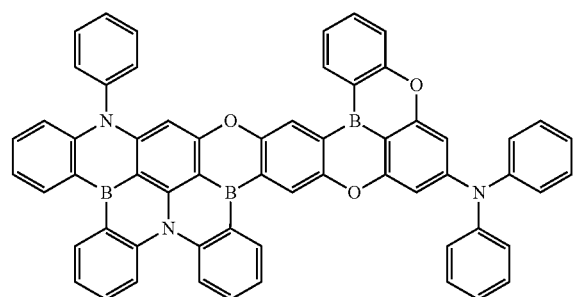
9
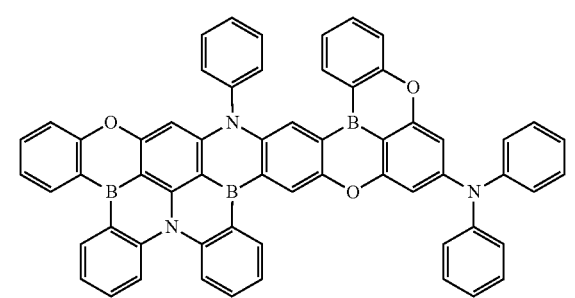
10
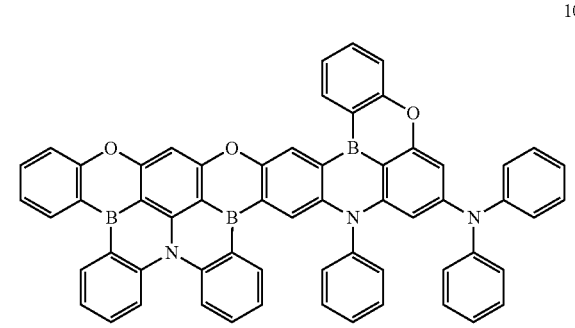
11
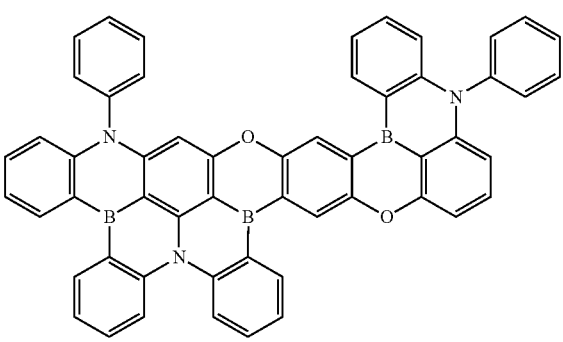
12
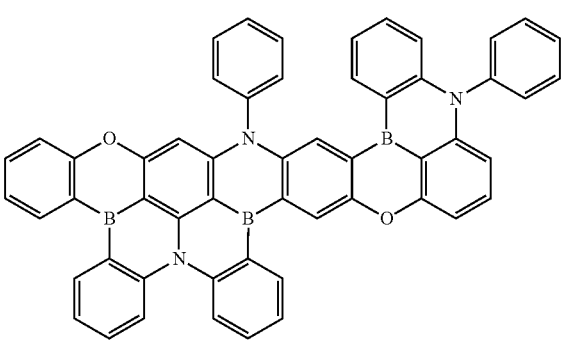
13
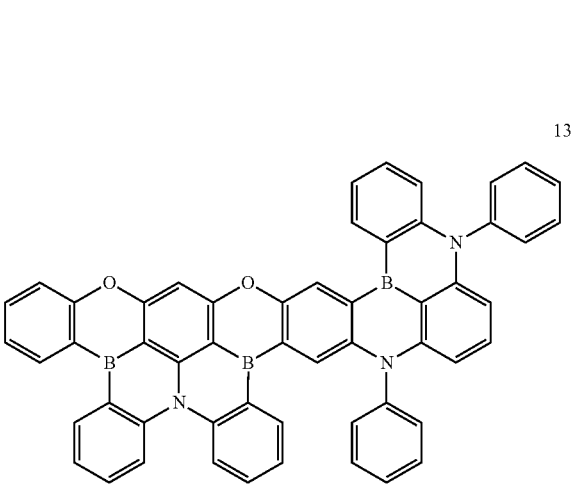
14
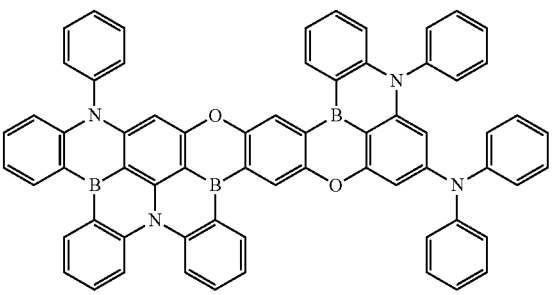

15
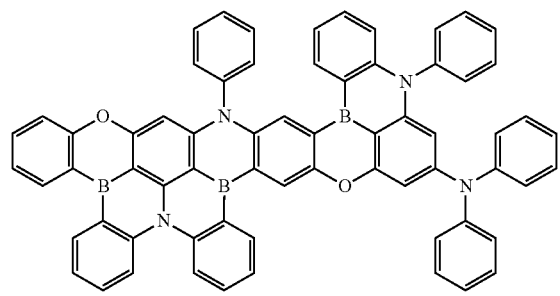
16
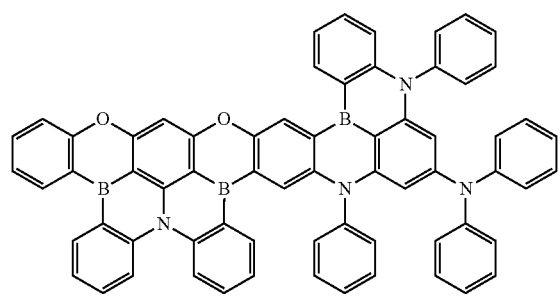
17
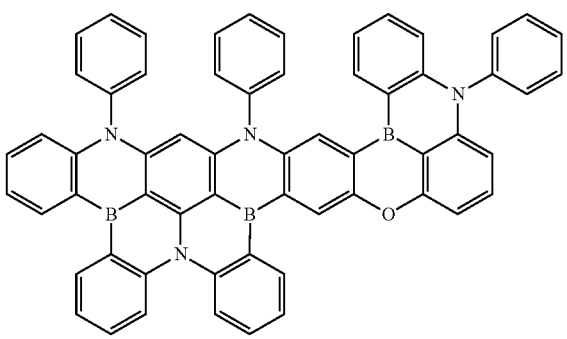
18
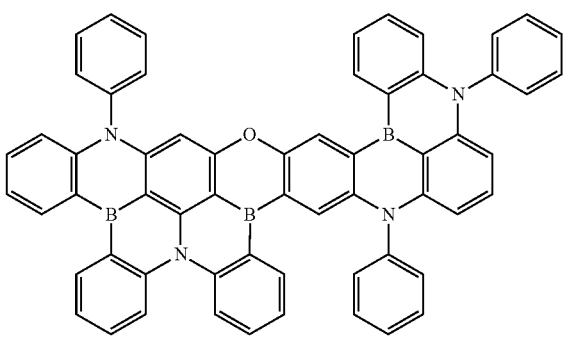
19
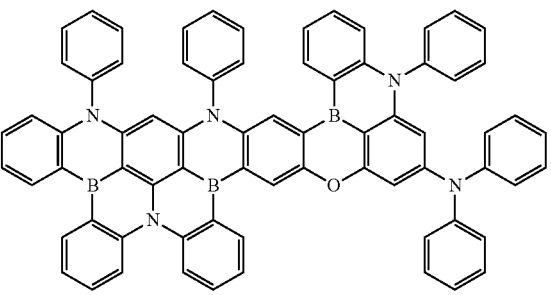
20
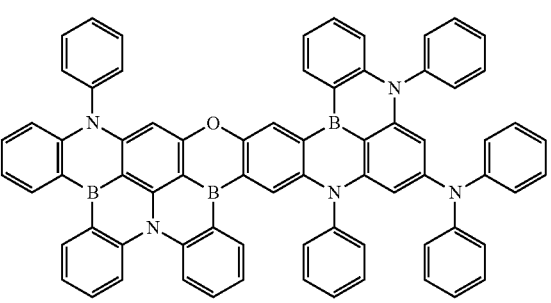
21
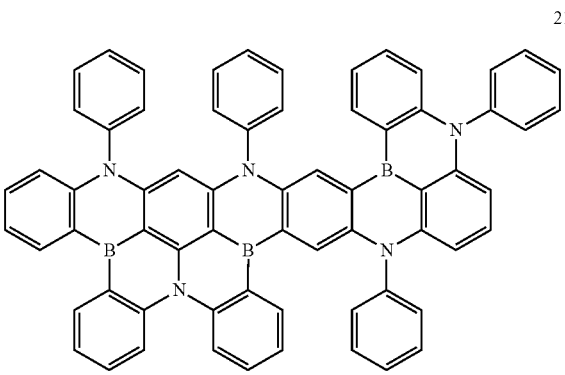
22
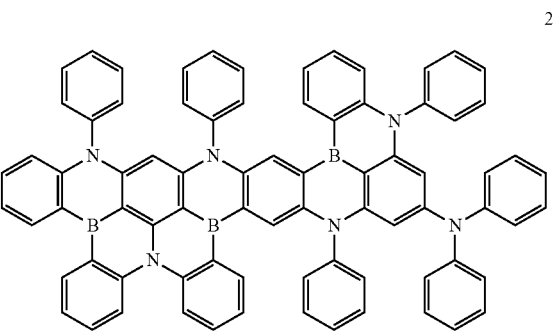

23

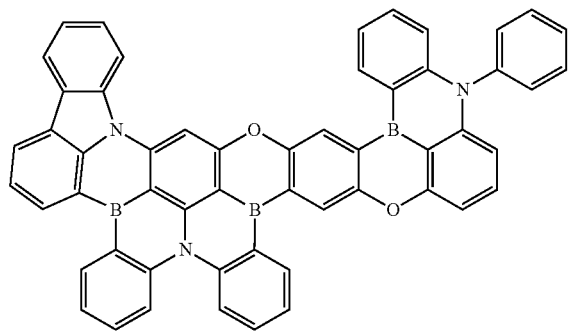

24

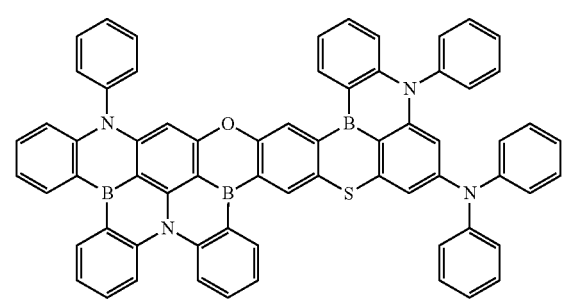

25

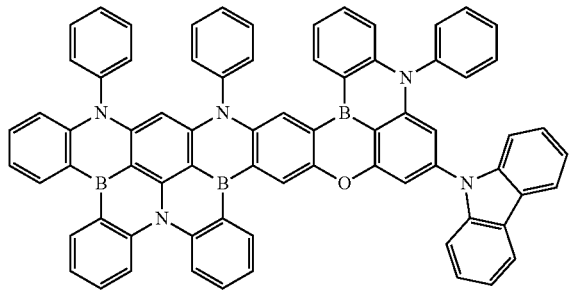

26

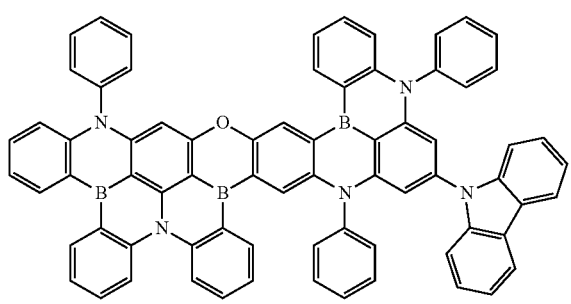

27

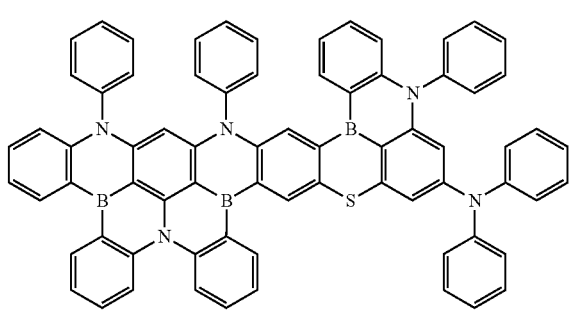

28

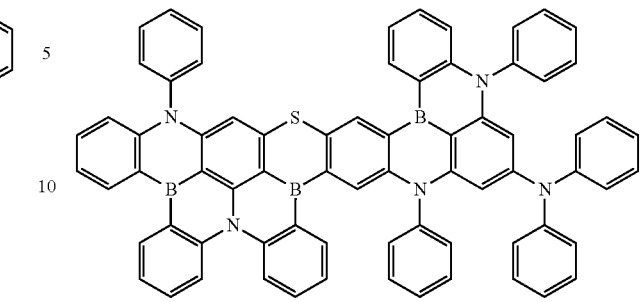

29

30

The fused polycyclic compound of an embodiment represented by Formula 1 may be a thermally activated delayed fluorescence light emitting material. In addition, the fused polycyclic compound of an embodiment represented by Formula 1 may be a thermally activated delayed fluorescence dopant having a difference ($\Delta E_{st}$) of a lowest triplet excitation energy level (T1 level) and a lowest singlet excitation energy level (S1 level) of 0.33 eV or less. The fused polycyclic compound of an embodiment represented by Formula 1 may be a thermally activated delayed fluorescence dopant having a difference ($\Delta E_{st}$) of the lowest triplet excitation energy level (T1 level) and the lowest singlet excitation energy level (S1 level) of 0.2 eV or less.

The fused polycyclic compound of an embodiment represented by Formula 1 may be a light emitting material having a central emission wavelength in a wavelength range of about 430 nm to about 490 nm. For example, the fused polycyclic compound of an embodiment represented by Formula 1 may be a blue thermally activated delayed fluorescence (TADF) dopant.

However, embodiments of the present disclosure are not limited thereto, and when the fused polycyclic compound of an embodiment is used as a light emitting material, the fused polycyclic compound may be used as a dopant material that emits light in various suitable wavelength regions such as a red light emitting dopant or a green light emitting dopant.

In the organic electroluminescence device 10 of an embodiment, the emission layer EML may emit delayed fluorescence. For example, the emission layer EML may emit thermally activated delayed fluorescence (TADF).

In addition, the emission layer EML of the organic electroluminescence device 10 may emit blue light. For example, the emission layer EML of the organic electroluminescence device 10 may emit blue light in a region of 490 nm or more. However, embodiments of the present disclosure are not limited thereto, and the emission layer EML may emit green light or red light.

In some embodiments, the organic electroluminescence device 10 of an embodiment may include a plurality of emission layers. The plurality of emission layers may be sequentially stacked and provided, and for example, the organic electroluminescence device 10 including the plurality of emission layers may emit white light. The organic electroluminescence device including a plurality of emission layers may be an organic electroluminescence device having a tandem structure. When the organic electroluminescence device 10 includes a plurality of emission layers, at least one emission layer EML may include the fused polycyclic compound of an embodiment described above.

In an embodiment, the emission layer EML may include a host and a dopant, and may include the above-described fused polycyclic compound as a dopant. For example, in the organic electroluminescence device 10 of an embodiment, the emission layer EML may include a host for delayed fluorescence emission and a dopant for delayed fluorescence emission, and may include the above-described fused polycyclic compound as a dopant for delayed fluorescence emission. The emission layer EML may include at least one of the fused polycyclic compounds represented by Compound Group 1 described above as a thermally activated delayed fluorescence dopant.

In an embodiment, the emission layer EML may be a delayed fluorescence emission layer, and the emission layer EML may include any suitable host material available in the art and the above-described fused polycyclic compound. For example, in an embodiment, the fused polycyclic compound may be used as a TADF dopant.

The emission layer EML may include any suitable host material available in the art. Any suitable material may be used as a host material of the emission layer EML, and although not particularly limited, the host material of the emission layer EML is selected from a fluoranthene derivative, a pyrene derivative, an arylacetylene derivative, an anthracene derivative, a fluorene derivative, a perylene derivative, a chrysene derivative, etc. In some embodiments, the host material of the emission layer EML may be selected from a pyrene derivative, a perylene derivative, or an anthracene derivative. For example, an anthracene derivative represented by Formula 5 below may be used as a host material of the emission layer EML.

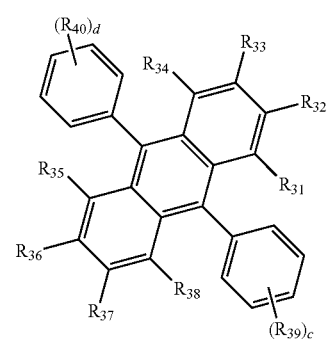

Formula 5

In Formula 5, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. In some embodiments, $R_{31}$ to $R_{40}$ may be bonded to an adjacent group to form a saturated hydrocarbon ring or unsaturated hydrocarbon ring.

In Formula 5, c and d may be each independently an integer of 0 to 5.

Formula 5 may be represented by any one of Compounds 5-1 to 5-16 below.

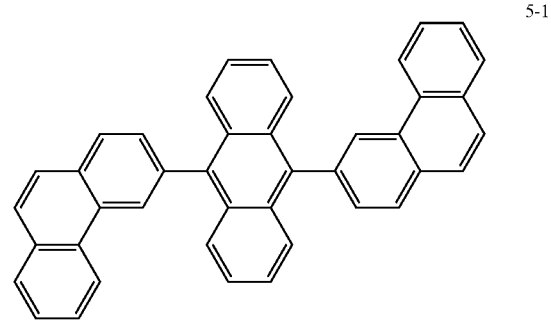

5-1

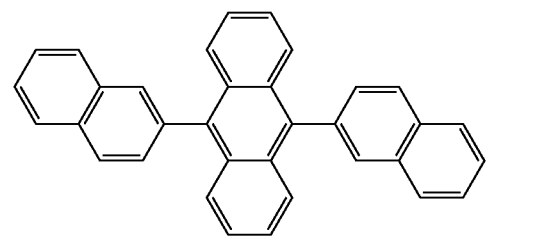

5-2

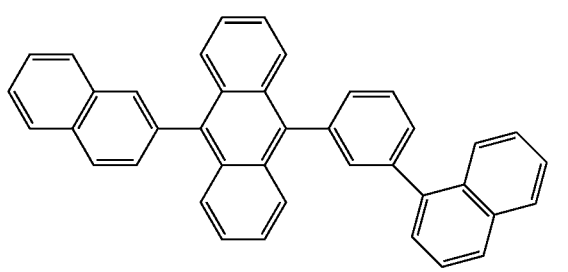

5-3

5-4
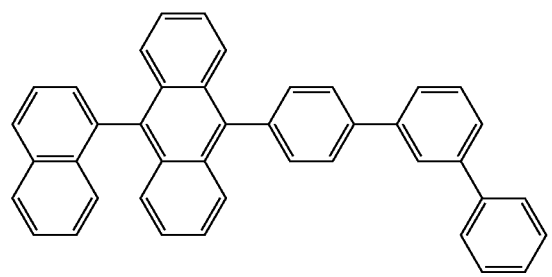
5-5
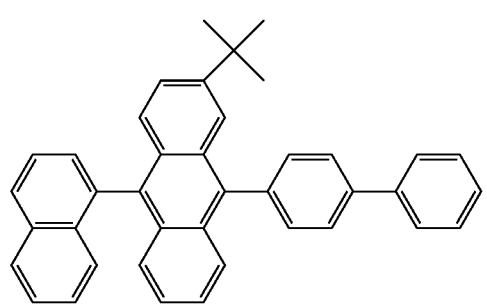
5-6
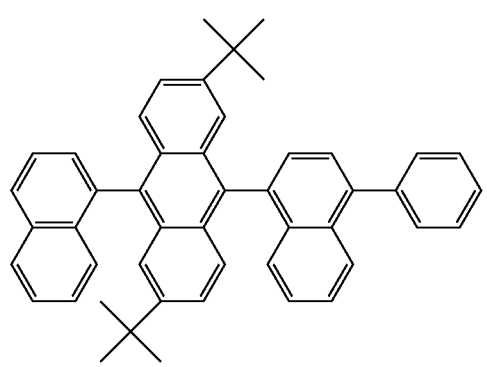
5-7
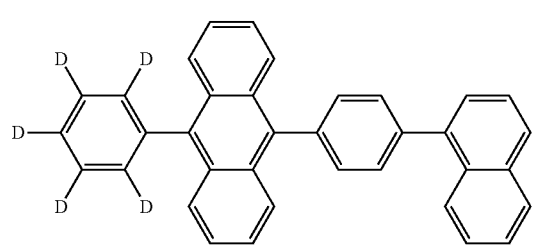
5-8
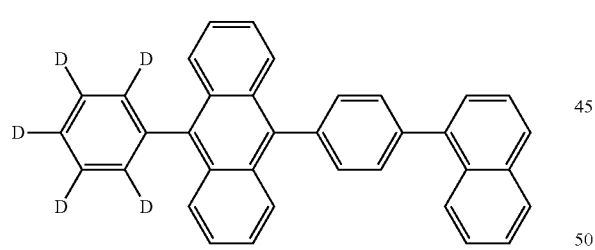
5-9
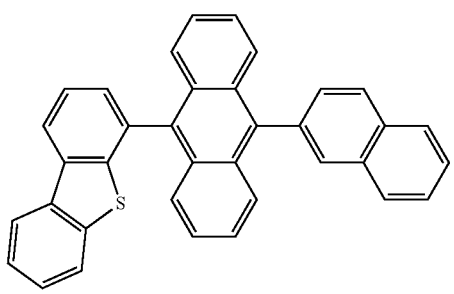
5-10
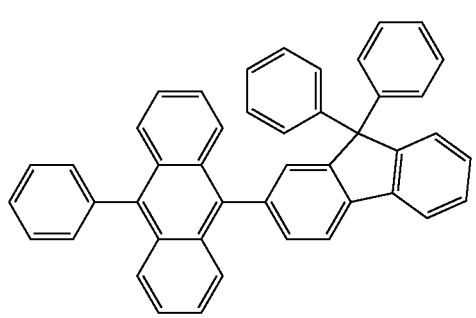
5-11
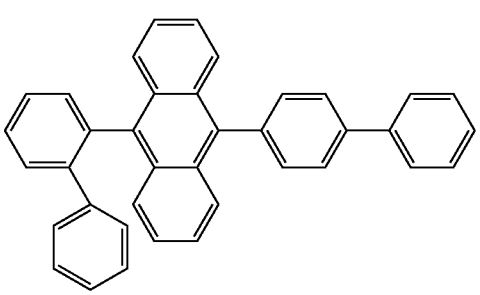
5-12
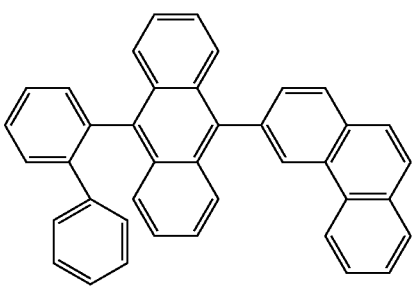
5-13
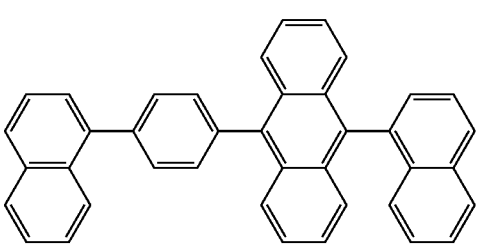

5-14

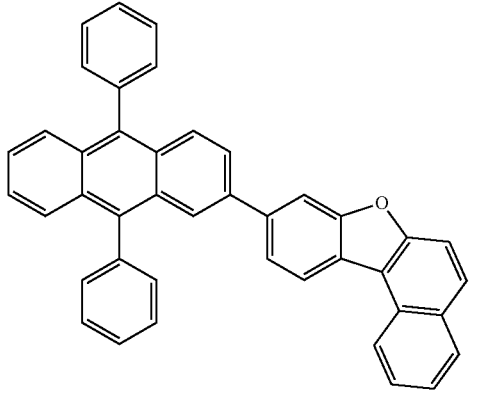

5-15

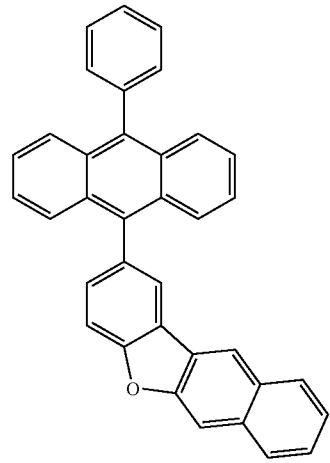

5-16

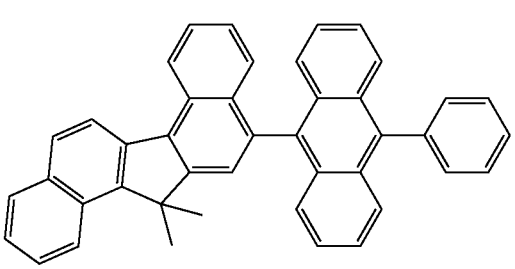

In an embodiment, the emission layer EML may include, as a host material, tris(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris (carbazol sol-9-yl) triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(carbazolyl-9-yl)benzene (mCP), 9,10-di(naphthalen-2-yl)anthracene (DNA), etc. However, embodiments of the present disclosure are not limited thereto, and in addition to the presented host materials, any suitable delayed fluorescence host materials available in the art may be included.

In some embodiments, in the organic electroluminescence device 10 of an embodiment, the emission layer EML may further include any suitable dopant material available in the art.

In an embodiment, the emission layer EML may further include, as a dopant, styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (e.g., 2,5,8,11-tetra-t-butylperylene (TBP), pyrene and the derivatives thereof (e.g., 1,1-dipyrene, 1,4-dipyrenylbenzene, 1,4-bis(N,N-diphenylamino)pyrene, etc.

In addition, in an embodiment, the emission layer EML may include two dopant materials having different lowest triplet excitation energy levels (T1 level). In the organic electroluminescence device 10 of an embodiment, the emission layer EML may include a host having a first lowest triplet excitation energy level, a first dopant having a second lowest triplet excitation energy level lower than the first lowest triplet excitation energy level, and a second dopant having a third lowest triplet excitation energy level lower than the second lowest triplet excitation energy level. For example, the emission layer EML may include a host having a lowest triplet excitation energy level, a first dopant having a lowest triplet excitation energy level lower than the lowest triplet excitation energy level of the host, and a second dopant having a lowest triplet excitation energy level lower than the lowest triplet excitation energy level of the first dopant. In an embodiment, the emission layer EML may include the fused polycyclic compound of an embodiment described above as a first dopant.

In the organic electroluminescence device 10 of an embodiment including a host, a first dopant, and a second dopant in the emission layer EML, the first dopant may be a delayed fluorescence dopant, and the second dopant may be a fluorescence dopant. In addition, the fused polycyclic compound represented by Formula 1 in the organic electroluminescence device 10 of an embodiment may serve as an assistant dopant.

For example, when the emission layer EML of the organic electroluminescence device 10 of an embodiment includes a plurality of dopants, the emission layer EML may include the above-described polycyclic compound of an embodiment as a first dopant, and may include any suitable dopant material available in the art as a second dopant. For example, when the emission layer EML emits blue light, the emission layer EML may further include, as the second dopant, any one selected from the group consisting of styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-Avinyl)phenyl)-N-phenylbenzenamine (N-BDAVBi), perylene and the derivatives thereof (e.g., 2,5,8,11-tetra-t-butylperylene (TBP), pyrene and the derivatives thereof (e.g., 1,1-dipyrene, 1,4-dipyrenylbenzene, 1,4-bis(N,N-diphenylamino)pyrene), etc. In addition, as the second dopant, a metal complex or an organometallic complex including Ir, Pt, Pd, etc., such as (4,6-F$_2$ppy)$_2$Irpic, as a core atom may be used.

In some embodiments, in the organic electroluminescence device 10 of an embodiment including the fused polycyclic compound of an embodiment as the first dopant of the emission layer EML, the emission layer EML may emit green light or red light and the second dopant material used in this case may be any suitable dopant available in the art, any suitable green fluorescence dopant available in the art, or any suitable red fluorescence dopant available in the art.

In the organic electroluminescence device 10 of an embodiment, the emission layer EML may be a phosphorescence emission layer. For example, the fused polycyclic compound according to an embodiment may be included in the emission layer EML as a phosphorescence host material.

In the organic electroluminescence device 10 of an embodiment illustrated in FIGS. 1 to 4, an electron transport region ETR is provided on the emission layer EML. The electron transport region ETR may include at least one of a hole blocking layer HBL, an electron transport layer ETL, or an electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, from about 1,000 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method, etc.

When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryliumbis(benzoquinolin-10-olate (Bebq2), 9,10-di(naphthalene-2-yl)anthracene (ADN), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without a substantial increase in driving voltage.

When the electron transport region ETR includes the electron injection layer EIL, the electron transport region ETR may be a halogenated metal such as LiF, NaCl, CsF, RbCl, RbI, and CuI, a lanthanide metal such as Yb, a metal oxide such as $Li_2O$ and BaO, or lithium quinolate (LiQ), but is not limited thereto. The electron injection layer EIL may also be formed of a mixture material of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, or metal stearates. The thickness of the electron injection layers EIL may be from about 1 Å to about 100 Å, and from about 3 Å to about 90 Å. If the thickness of the electron injection layers EIL satisfies the above-described range, suitable or satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP) and 4,7-diphenyl-1,10-phenanthroline (Bphen), but is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, indium tin oxide (ITO), indium zinc oxide (IZO), zinc oxide (ZnO), or indium tin zinc oxide (ITZO).

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, or oxides of one or more thereof. The second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be coupled with an auxiliary electrode. If the second electrode EL2 is coupled with the auxiliary electrode, the resistance of the second electrode EL2 may decrease.

In some embodiments, the organic electroluminescence device 10 of an embodiment may further include a buffer layer between the emission layer EML and the electron transport region ETR. The buffer layer may adjust the concentration of excitons generated in the emission layer EML. For example, the buffer layer may include some of the emission layer EML material. The buffer layer may include a host material among the emission layer EML materials. The lowest triplet excitation energy level of the buffer layer material may be adjusted above the lowest triplet excitation energy level of the second dopant or below the lowest triplet excitation energy level of the second dopant, depending on the combination of host and dopant materials included in the emission layer EML.

In some embodiments, a capping layer CPL may be further on the second electrode EL2 of the organic electroluminescence device 10 of an embodiment. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl)triphenylamine (TCTA), etc.

The organic electroluminescence device 10 according to an embodiments of the present disclosure include the fused polycyclic compound of an embodiment described above in the emission layer EML between the first electrode EL1 and the second electrode EL2 to achieve high luminous efficiency. In addition, the fused polycyclic compound according to an embodiment may be a thermally activated delayed fluorescence dopant, and the emission layer EML may include the fused polycyclic compound of an embodiment to emit thermally activated delayed fluorescence, thereby achieving high luminous efficiency.

In some embodiments, the fused polycyclic compound of an embodiment described above may be included as a material for the organic electroluminescence device 10 in an organic layer other than the emission layer EML. For example, the organic electroluminescence device 10 according to an embodiment of the present disclosure may include the fused polycyclic compound described above in at least one organic layer between the first electrode EL1 and the second electrode EL2 or in the capping layer CPL on the second electrode EL2.

The fused polycyclic compound of an embodiment described above includes three boron atoms, and a structure in which seven aromatic rings are coupled via three boron atoms and five hetero atoms, and thus, compared to an existing polycyclic compound, the fused polycyclic compound of an embodiment has a relatively lower difference ($\Delta E_{st}$) between the lowest triplet excitation energy level (T1 level) and the lowest singlet excitation energy level (S1 level), thereby further improving luminous efficiency of an organic electroluminescence device when used as a light emitting material.

Hereinafter, with reference to Examples and Comparative Examples, compounds according to embodiments of the present disclosure and organic electroluminescence devices of embodiments will be described in more detail. In addition, the Examples shown below are illustrated only for the understanding of the subject matter of the present disclosure, and the scope of the present disclosure is not limited thereto.

EXAMPLES

1. Synthesis of Fused Polycyclic Compounds

First, a process of synthesizing a fused polycyclic compound according to certain embodiments will be described in more detail by exemplifying a process of synthesizing Compounds 29, 30, 19, 20, and 14. In addition, a process of synthesizing a fused polycyclic compound, which will be described hereinafter, is provided as an example, and thus a process of synthesizing a compound according to an embodiment of the present disclosure is not limited to the Examples below.

(1) Synthesis of Compounds 29 and 30

Fused polycyclic Compounds 29 and 30 according to an embodiment may be synthesized by, for example, the following reaction.

Reaction Formula 1

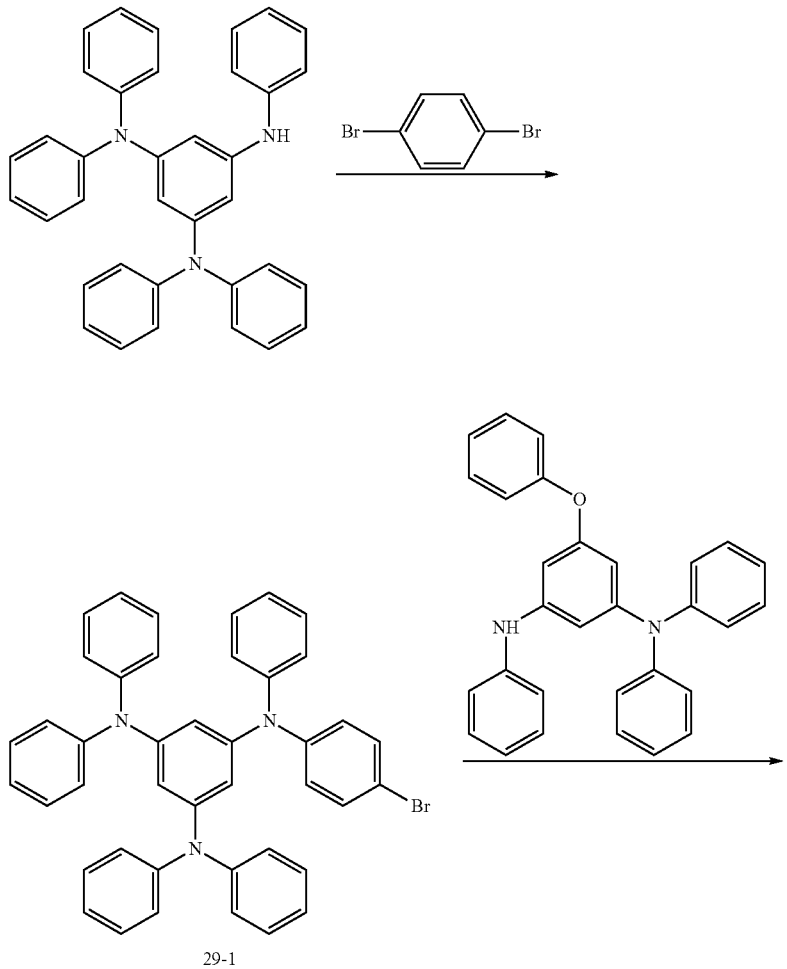

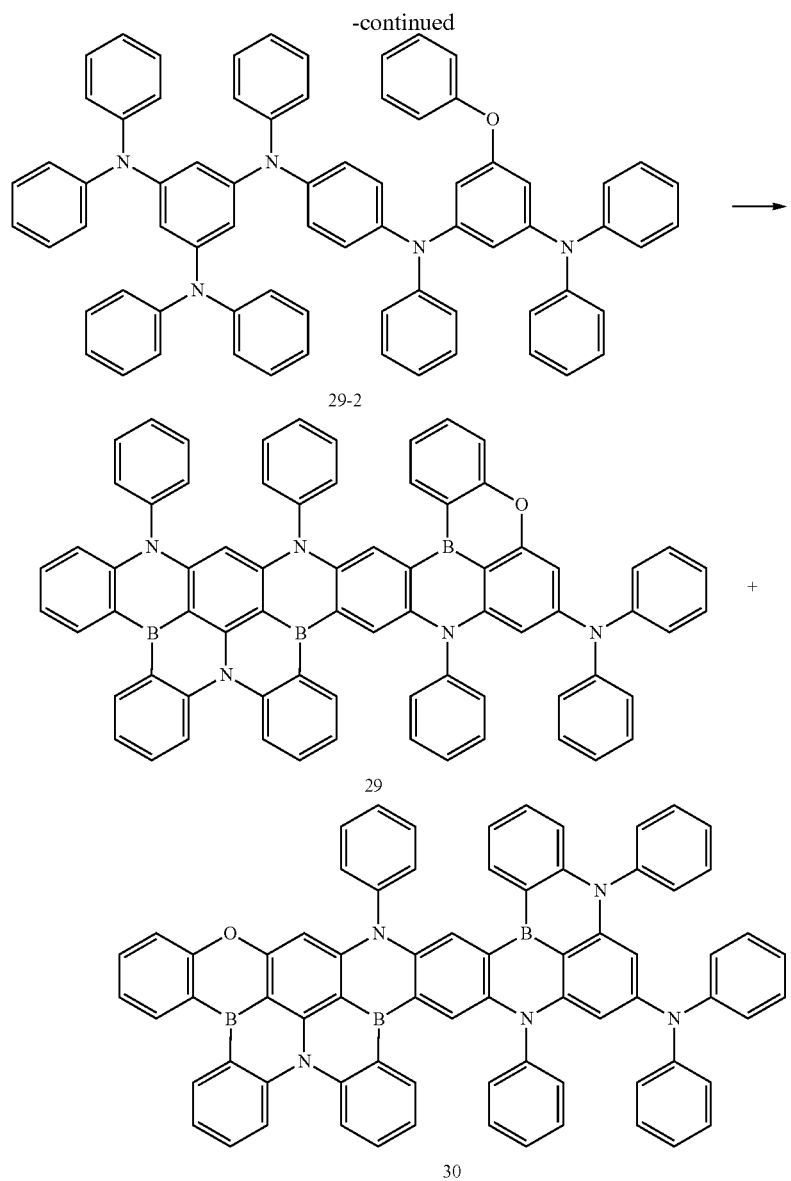

Synthesis of Intermediate 29-1

N1,N1,N3,N3,N5-pentaphenylbenzene-1,3,5-triamine (1 eq), 1,4-dibromobenzene (2 eq), tris (dibenzylideneacetone) dipalladium(0) (0.05 eq), tri-tert-butylphosphine (0.1 eq), and sodium tert-butoxide (3 eq) were dissolved in toluene and stirred at 100° C. for 12 hours in a nitrogen atmosphere. After cooling, the resultant mixture was washed 3 times with ethyl acetate and water, and then the obtained organic layer was dried over MgSO$_4$ and dried under reduced pressure. Intermediate 29-1 was obtained by column chromatography. (Yield: 75%)

Synthesis of Intermediate 29-2

Intermediate 29-1 (1 eq), 5-phenoxy-N1,N1,N3-triphenylbenzene-1,3-diamine (1 eq), tris (dibenzylideneacetone) dipalladium(0) (0.05 eq), tri-tert-butylphosphine (0.1 eq), sodium tert-butoxide (3 eq) were dissolved in toluene and stirred at 100° C. for 12 hours in a nitrogen atmosphere. After cooling, the resultant mixture was washed three times with ethyl acetate and water, and then the obtained organic layer was dried over MgSO$_4$ and dried under reduced pressure. Intermediate 29-2 was obtained by column chromatography. (Yield: 68%)

Synthesis of Compounds 29 and 30

Intermediate 29-2 (1 eq) and triphenylborane (2 eq) were dissolved in ortho dichlorobenzene, the flask was cooled to 0° C. in a nitrogen atmosphere, and then BBr$_3$ (5 eq) was slowly injected. After completing the injection, the temperature was raised to 150° C. and stirred for 24 hours. After cooling, triethylamine was slowly dropped into the flask until the exothermic reaction stopped, and then when the reaction was terminated, hexane was added, and a solid was precipitated and filtered. The obtained solid was purified by silica filtration and then purified by MC/Hex recrystallization to obtain Compounds 29 and 30.

(Compound 29 yield: 5%, Compound 30 yield: 2%)

(2) Synthesis of Compounds 19 and 20

Fused polycyclic compounds 19 and 20 according to an embodiment may be synthesized, for example, by the following reaction.

Reaction Formula 2
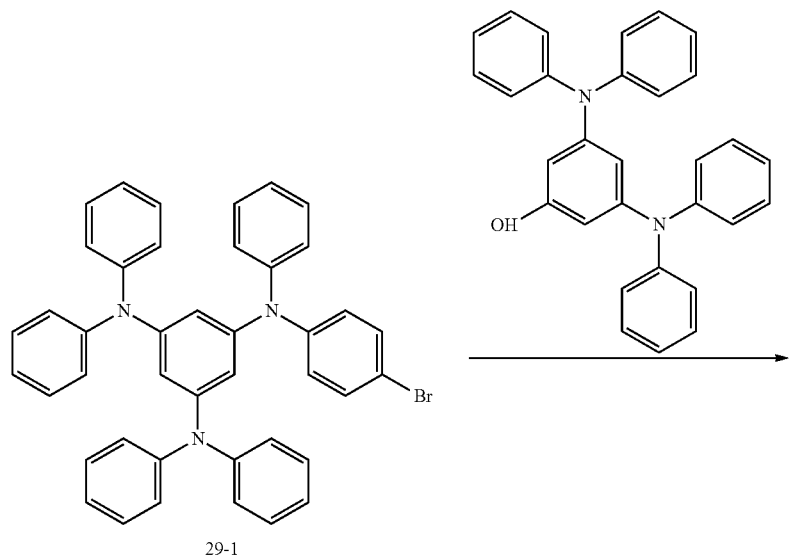
29-1
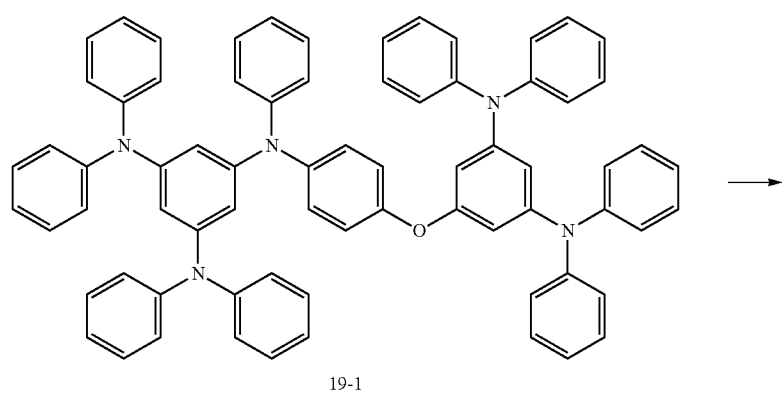
19-1
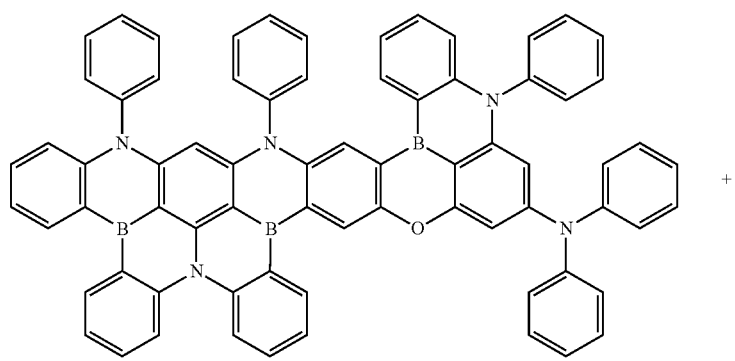
19

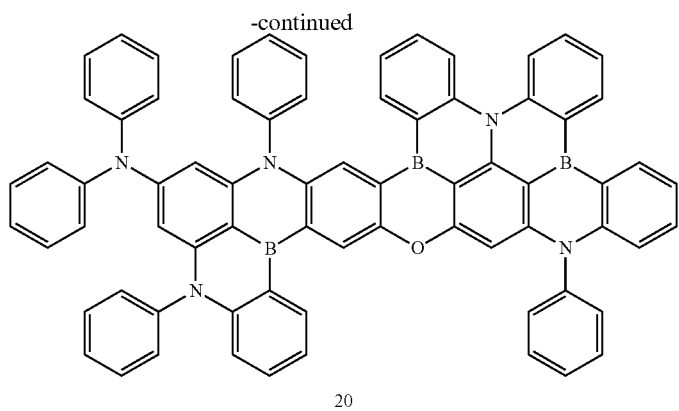

20

Synthesis of Intermediate 19-1

Intermediate 29-1 (1 eq), 3,5-bis(diphenylamino)phenol (1 eq), CuI (0.1 eq), 1,10-Phenanthroline (0.1 eq), and K₃PO₄ (4 eq) were dissolved in DMF, and stirred at 165° C. for 36 hours. After cooling, the solvent was removed under reduced pressure, washed three times with dichloromethane and water, and then the organic layer obtained by separation was dried over MgSO₄ and dried under reduced pressure. Intermediate 19-1 was obtained by column chromatography. (Yield: 65%)

Synthesis of Compounds 19 and 20

Compounds 19 and 20 were synthesized in substantially the same manner as used for the synthesis of Compounds 29 and 30, except that Intermediate 19-1 was used instead of Intermediate 29-2.

(Compound 19 yield: 5%, Compound 20 yield: 3%)

(3) Synthesis of Compound 14

Fused polycyclic compound 14 according to an embodiment may be synthesized, for example, by the following reaction.

[Reaction Formula 3]

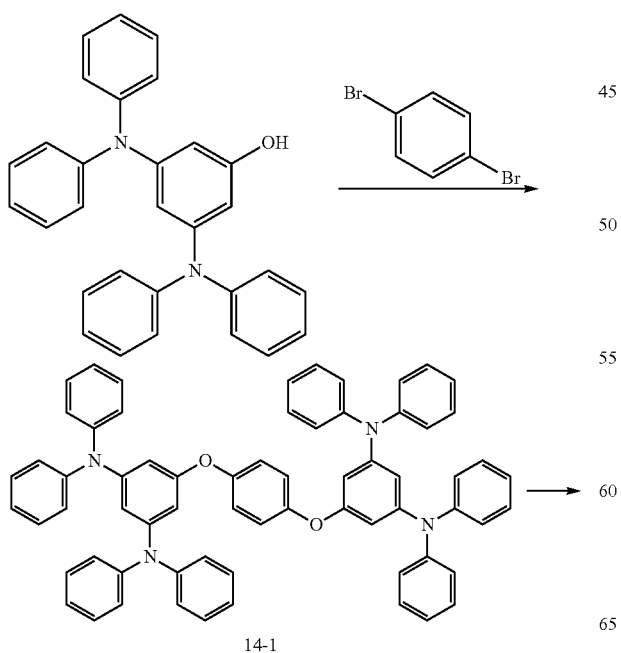

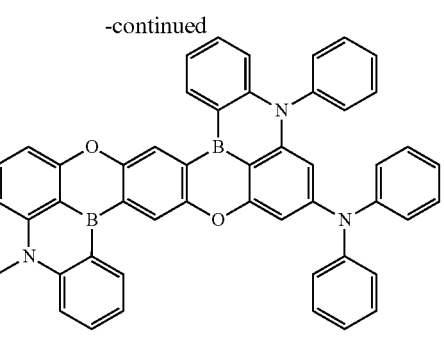

14

Synthesis of Intermediate 14-1

1,4-dibromobenzene (1 eq), 3,5-bis(diphenylamino)phenol (3 eq), CuI (0.2 eq), 1,10-Phenanthroline (0.4 eq), and K₃PO₄ (4 eq) were dissolved in DMF and stirred at 165° C. for 36 hours. After cooling, the solvent was removed under reduced pressure, washed three times with dichloromethane and water, and then the organic layer obtained by separation was dried over MgSO₄ and dried under reduced pressure. Intermediate 14-1 was obtained by column chromatography. (Yield: 45%)

Synthesis of Compound 14

Compound 14 was synthesized in substantially the same manner as used for the synthesis of Compounds 29 and 30, except that Intermediate 14-1 was used instead of Intermediate 29-2. (Yield: 6%)

2. NMR and Molecular Weight Data of Synthesized Compounds

NMR and molecular weight data of the synthesized compounds are shown in Table 1 below.

TABLE 1

| Compound | H NMR (δ) | Calc. | Found |
|---|---|---|---|
| 29 | 9.34-9.30 (1H, m), 9.21-9.15 (3H, m), 8.81-8.65 (2H, m) 7.51-7.36 (12H, m), 7.23-7.15 (10H, m), 7.09-6.86 (14H, m) 5.92-5.78 (4H, m) | 1029.6 | 1029.59 |
| 30 | 9.18-9.12(1H, m), 9.20-9.11 (3H, m), 8.88-8.68 (2H, m) 7.51-7.36 (11H, m), 7.23-7.11 (11H, m), 7.09-6.81 (14H, m) 5.94-5.77 (4H, m) | 1029.6 | 1029.59 |

TABLE 1-continued

| Compound | H NMR (δ) | Calc. | Found |
|---|---|---|---|
| 19 | 9.13-9.02 (4H, m), 8.85-8.78 (1H, s), 8.65-8.59 (1H, m)7.52-7.37 (18H, m), 7.24-7.15 (6H, m), 7.06-6.84 (12H, m), 5.90-5.75 (4H, m) | 1029.6 | 1029.59 |
| 20 | 8.81-8.68 (3H, m), 8.61-8.45 (3H, m) 7.49-7.31 (17H, m), 7.23-7.15 (7H, m), 7.09-6.82 (12H, m), 5.90-5.73 (4H, m) | 1029.6 | 1029.59 |
| 14 | 9.17-8.98 (4H, m), 8.91-8.79 (2H, m)7.64-7.43 (17H, m), 7.24-7.17 (4H, m), 7.15-6.86 (10H, m) 6.09-5.86 (4H, m) | 954.49 | 954.48 |

3. Manufacture and Evaluation of Organic Electroluminescence Devices including Fused Polycyclic Compounds (Manufacture of Organic Electroluminescence Devices)

Organic electroluminescence devices of an embodiment including a fused polycyclic compound of an embodiment in an emission layer were manufactured by the following process. The organic electroluminescence devices of Examples 1 to 5 were manufactured using the fused polycyclic compounds of Example Compounds 14, 19, 20, 29, and 30 as dopant materials for an emission layer. Comparative Examples 1 to 4 are organic electroluminescence devices manufactured using Comparative Example Compounds C1 to C4 as dopant materials for an emission layer.

In order to form a first electrode, an ITO glass substrate (Corning, 15 Ω/cm² (1200 Å)) was cut to a size of about 50 mm×50 mm×0.7 mm, subjected to ultrasonic cleaning using isopropyl alcohol and pure water for 5 minutes respectively and ultraviolet irradiation for about 30 minutes, and then exposed to ozone for cleaning to form the glass substrate in a vacuum deposition apparatus.

NPD was vacuum-deposited to a thickness of about 300 Å to form a hole injection layer on an upper part of the glass substrate, and then a hole transport compound, TCTA, was vacuum-deposited to a thickness of 200 Å to form a hole transport layer. CzSi was vacuum-deposited to a thickness of 100 Å on the hole transport layer. On the layer, mCP and an Example compound or a Comparative Example compound of an embodiment were co-deposited to a weight ratio of 99:1 to form an emission layer having a thickness of 200 Å. Thereafter, an electron transport layer compound, TSPO1 was formed to a thickness of 200 Å, and an electron injection layer compound, TPBi was deposited to a thickness of 300 Å. On the electron transport layer, LiF, an alkali metal halide, was deposited to a thickness of 10 Å, and Al was vacuum-deposited to a thickness of 3000 Å to form a LiF/Al second electrode to manufacture an organic electroluminescence device The compounds used in the manufacture of the organic electroluminescence devices of Examples and Comparative Examples are as follows.

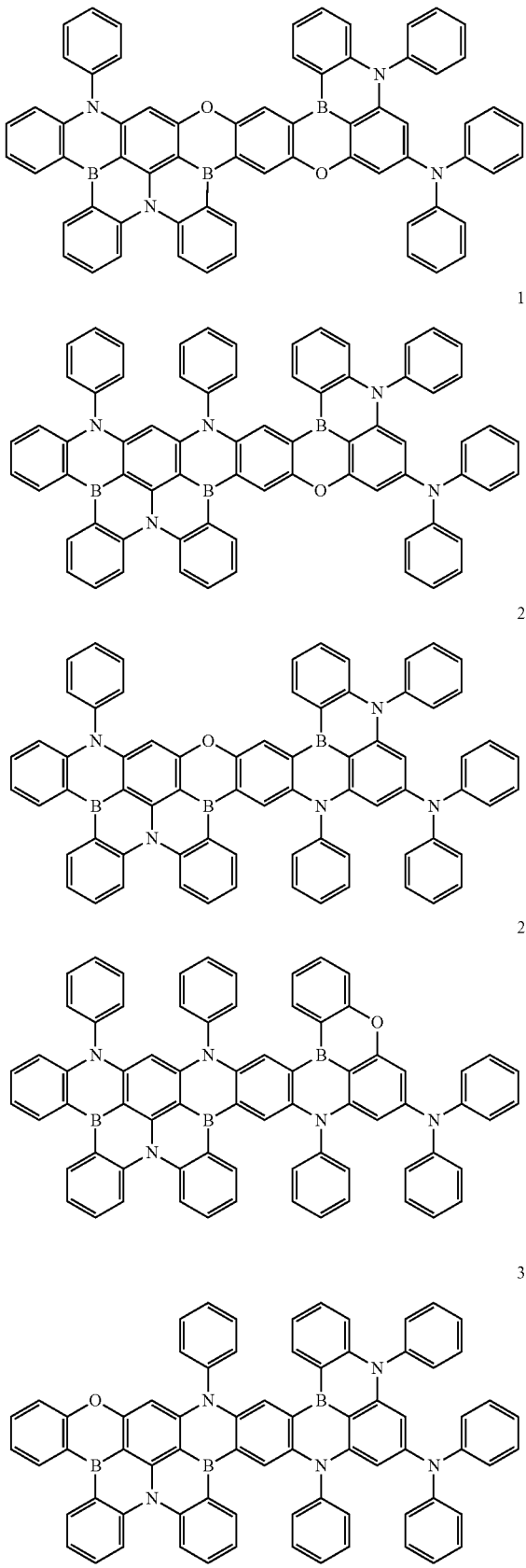

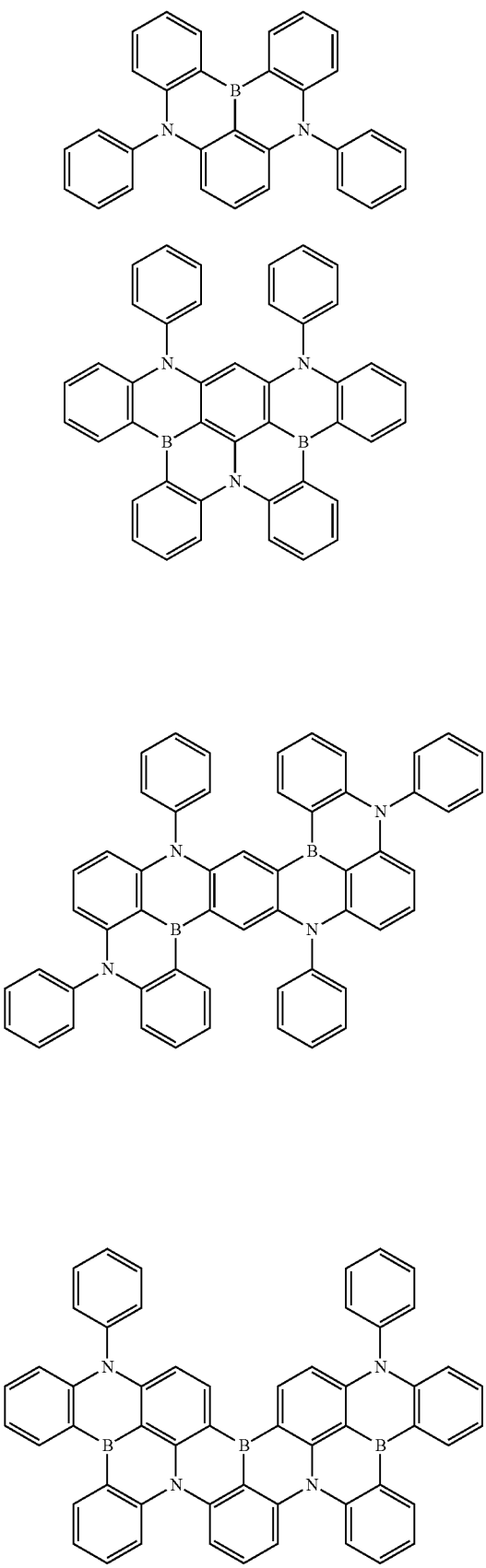
C1
C2
C3
C4
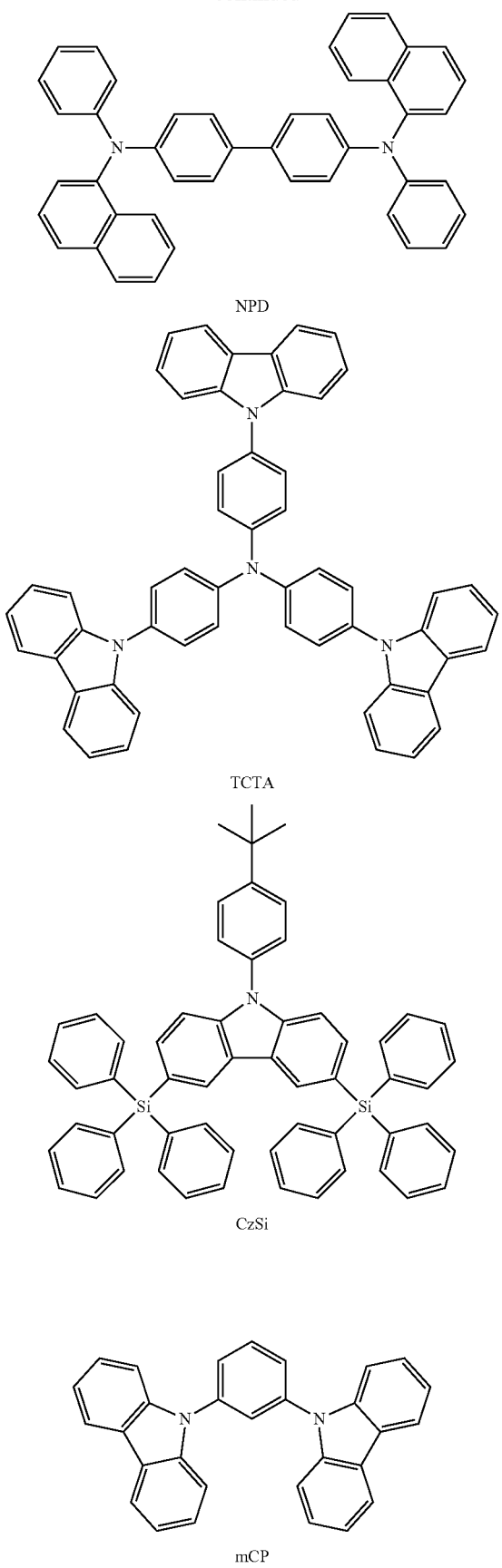
NPD
TCTA
CzSi
mCP

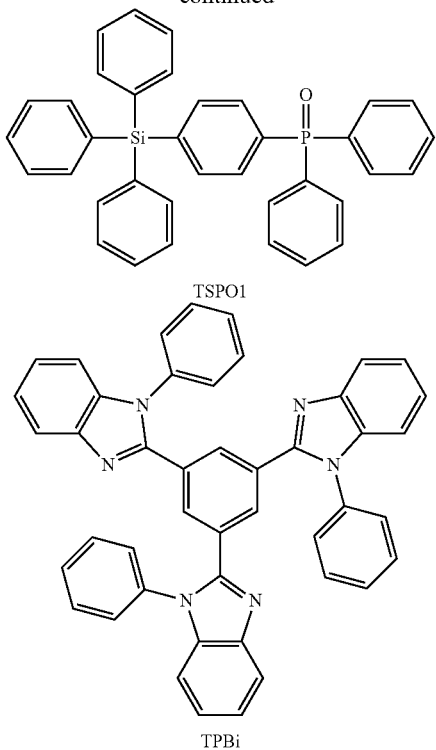

TSPO1

TPBi

Evaluation of Organic Electroluminescence Device Characteristics

Table 2 shows the evaluation results on the organic electroluminescence devices of Examples 1 to 5 and Comparative Examples 1 to 4. Table 2 shows and compares driving voltage, luminous efficiency, and external quantum efficiency (EQE) of the manufactured organic electroluminescence devices.

In the evaluation results of the characteristics of the Examples and Comparative Examples shown in Table 2, voltage and current density were measured using a source meter (Keithley Instrument, 2400 series), and external quantum efficiency (EQE) was measured using an external quantum efficiency measuring apparatus (Hamamatsu Photonics, C9920-12). The luminous efficiency shows a current efficiency value for a current density of 50 mA/cm$^2$.

TABLE 2

| Manufactured device | Emission layer dopant material | Driving voltage (V) | Luminous efficiency (cd/A) | external quantum efficiency (EQE) (%) | Emitted color |
|---|---|---|---|---|---|
| Example 1 | Compound 14 | 4.9 | 22.4 | 20.4 | Blue |
| Example 2 | Compound 19 | 4.8 | 24.2 | 22.3 | Blue |
| Example 3 | Compound 20 | 4.8 | 25.3 | 23.7 | Blue |
| Example 4 | Compound 29 | 4.6 | 24.8 | 24.2 | Blue |
| Example 5 | Compound 30 | 4.7 | 23.5 | 24.4 | Blue |
| Comparative Example 1 | Comparative Example Compound C1 | 5.7 | 19.3 | 19.2 | Blue |
| Comparative Example 2 | Comparative Example Compound C2 | 5.5 | 21.7 | 20.3 | Blue |
| Comparative Example 3 | Comparative Example Compound C3 | 6.2 | 20.3 | 20.1 | blue-green |
| Comparative Example 4 | Comparative Example Compound C4 | 6.0 | 19.6 | 18.5 | blue-green |

Referring to the results of Table 2, the Examples of the organic electroluminescence device using the fused polycyclic compound according to an embodiment of the present disclosure as an emission layer material emit blue light and have a low driving voltage value, relatively high luminous efficiency, and high external quantum efficiency as compared to the Comparative Examples. In the case of the Example Compounds, a multiple resonance phenomenon by an aromatic ring forming a fused ring introduces TADF characteristics, and, for example, the inclusion of three boron atoms and a structure in which seven aromatic rings are coupled via three boron atoms and five hetero atoms allows multiple resonances on a wide plate-like frame as compared to Compound C1 of Comparative Example 1, accordingly the organic electroluminescence devices of the Examples have improved luminous efficiency as compared to the organic electroluminescence devices of the Comparative Examples.

The fused polycyclic compound of an embodiment includes a structure in which 7 aromatic rings are coupled via 3 boron atoms and 5 hetero atoms to have a high oscillator strength value and a small $\Delta E_{st}$ value, and thus the fused polycyclic compound may be used as a delayed fluorescence light emitting material. In addition, the fused polycyclic compound of an embodiment may be used as a dopant material for an emission layer of an organic electroluminescence device to improve device efficiency.

An organic electroluminescence device of an embodiment may include a fused polycyclic compound of an embodiment to achieve improved luminous efficiency. In addition, the organic electroluminescence device of an embodiment may include a fused polycyclic compound of an embodiment as an emission layer material, thereby achieving high luminous efficiency in a wavelength range of blue light.

An organic electroluminescence device of an embodiment may have improved device properties of low driving voltage and high efficiency.

A fused polycyclic compound of an embodiment may be included in an emission layer of an organic electroluminescence device to contribute to making the organic electroluminescence device have high efficiency.

Although the subject matter of the present disclosure has been described with reference to example embodiments of the present disclosure, it will be understood that the subject matter of the present disclosure should not be limited to these example embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. An organic electroluminescence device comprising:
   a first electrode;
   a second electrode facing the first electrode; and
   a plurality of organic layers between the first electrode and the second electrode,
   wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides of one or more thereof,
   wherein at least one of the organic layers comprises a fused polycyclic compound represented by Formula 1 below:

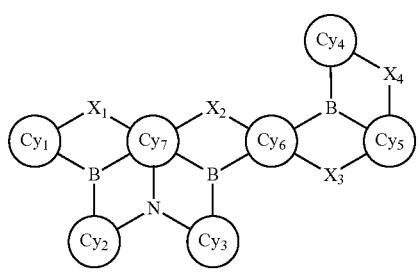

Formula 1 wherein in Formula 1 above,
$Cy_1$ to $Cy_7$ are each independently a substituted or unsubstituted aromatic hydrocarbon ring, or a substituted or unsubstituted aromatic heterocycle,
$X_1$ to $X_4$ are each independently $NR_a$, O, or S, and
$R_a$ is a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms.

2. The organic electroluminescence device of claim 1, wherein the organic layers comprise:
   a hole transport region on the first electrode;
   an emission layer on the hole transport region; and
   an electron transport region on the emission layer,
   wherein the emission layer comprises the fused polycyclic compound represented by Formula 1 above.

3. The organic electroluminescence device of claim 2, wherein the emission layer emits delayed fluorescence.

4. The organic electroluminescence device of claim 2, wherein the emission layer is a delayed fluorescence emission layer comprising a host and a dopant, and
   the dopant comprises the fused polycyclic compound represented by Formula 1 above.

5. The organic electroluminescence device of claim 2, wherein the emission layer comprises:
   a host having a lowest triplet excitation energy level;
   a first dopant having a lowest triplet excitation energy level lower than the lowest triplet excitation energy level of the host; and
   a second dopant having a lowest triplet excitation energy level lower than the lowest triplet excitation energy level of the first dopant,
   wherein the first dopant comprises the fused polycyclic compound represented by Formula 1 above.

6. The organic electroluminescence device of claim 5, wherein the first dopant is a delayed fluorescence dopant, and
   the second dopant is a fluorescence dopant.

7. The organic electroluminescence device of claim 1, wherein the fused polycyclic compound represented by Formula 1 above is represented by Formula 2 below:

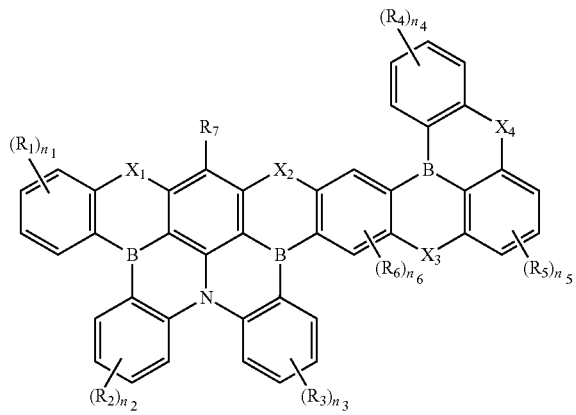

Formula 2 wherein in Formula 2 above,
$R_1$ to $R_7$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to 60 ring-forming carbon atoms, a substituted or unsubstituted heteroaryl group having 1 to 60 ring-forming carbon atoms, or bonded to an adjacent group to form a ring,
$n_1$ to $n_4$ are each independently an integer of 0 to 4,
$n_5$ is an integer of 0 to 3,
$n_6$ is an integer of 0 to 2, and
$X_1$ to $X_4$ are the same as defined with respect to Formula 1 above.

8. The organic electroluminescence device of claim 7, wherein the fused polycyclic compound represented by Formula 1 above is represented by Formula 3 below:

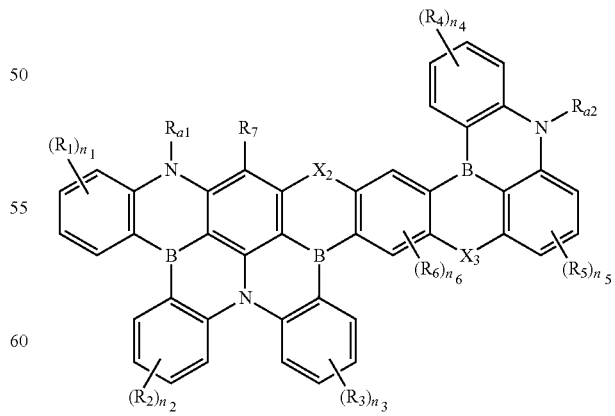

Formula 3 wherein in Formula 3 above,
$R_{a1}$ and $R_{a2}$ are each independently a substituted or unsubstituted aryl group having 6 to 60 ring-forming carbon atoms, or a substituted or unsubstituted heteroaryl group having 1 to 60 ring-forming carbon atoms, and $X_2$, $X_3$, $R_1$ to $R_7$, and $n_1$ to $n_6$ are the same as defined with respect to Formulas 1 and 2 above.

9. The organic electroluminescence device of claim 7, wherein the fused polycyclic compound represented by Formula 1 above is represented by Formula 4 below:

Formula 4

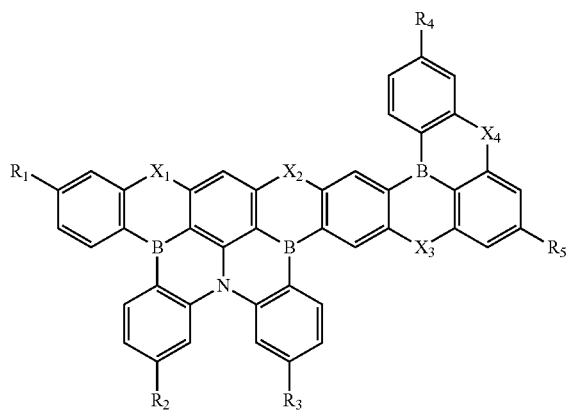

wherein in Formula 4 above, $X_1$ to $X_4$, $R_1$ to $R_5$ are the same as defined with respect to Formulas 1 and 2 above.

10. The organic electroluminescence device of claim 9, wherein in Formula 4 above, $R_1$ to $R_5$ are each independently a substituted or unsubstituted amine group, or a substituted or unsubstituted carbazole group.

11. The organic electroluminescence device of claim 1, wherein in Formula 1 above, when $X_1$ to $X_4$ are each independently $NR_a$, $R_a$ is a substituted or unsubstituted phenyl group.

12. The organic electroluminescence device of claim 1, wherein the fused polycyclic compound is at least one of the compounds represented in Compound Group 1 below:

Compound Group 1

1

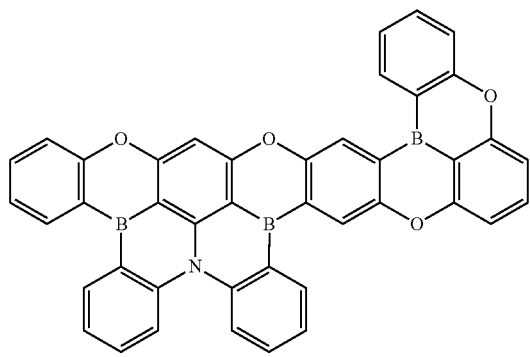

-continued

2

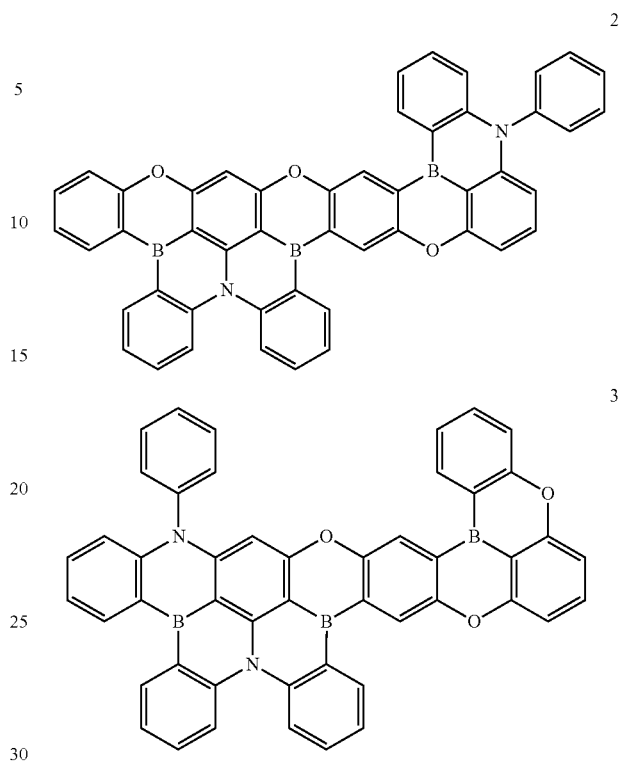

3

4

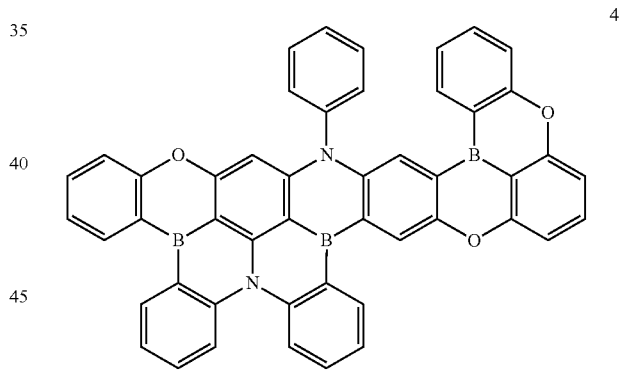

5

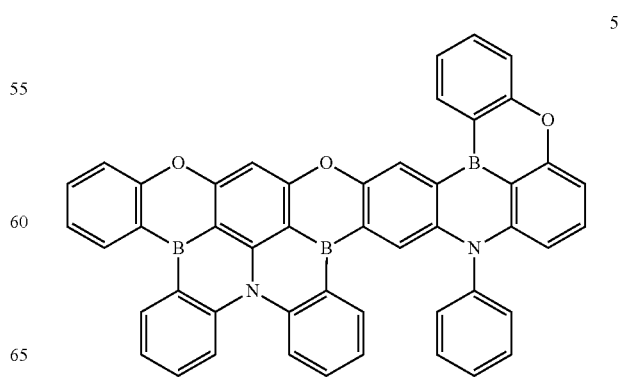

6
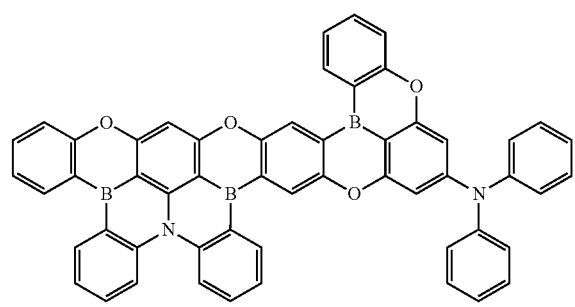
7
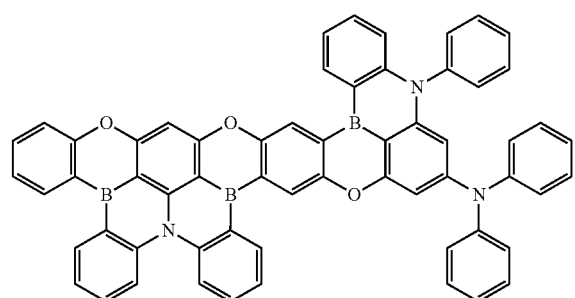
8
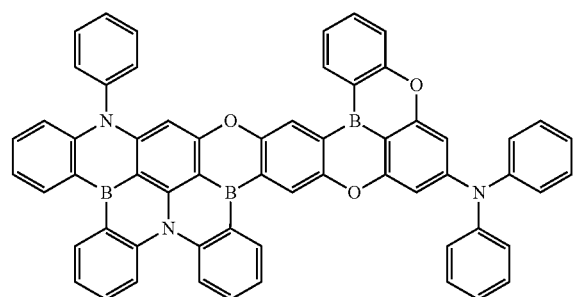
9
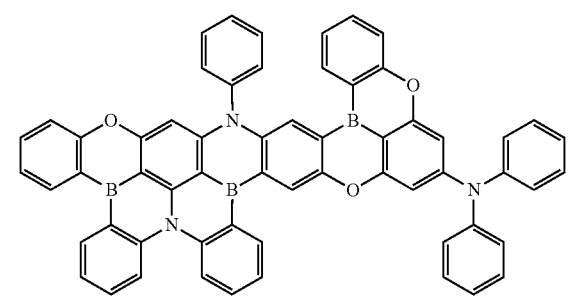
10
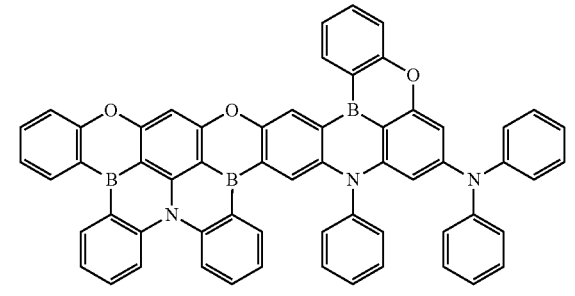
11
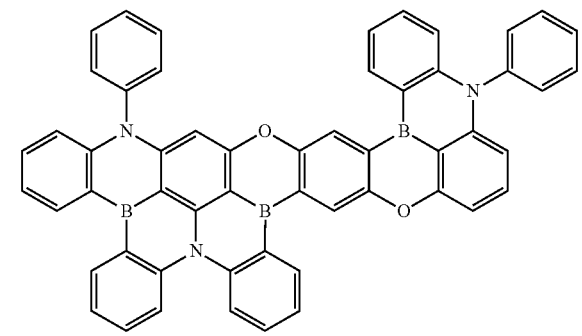
12
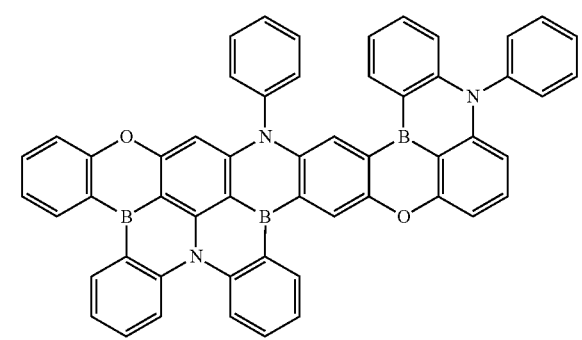
13
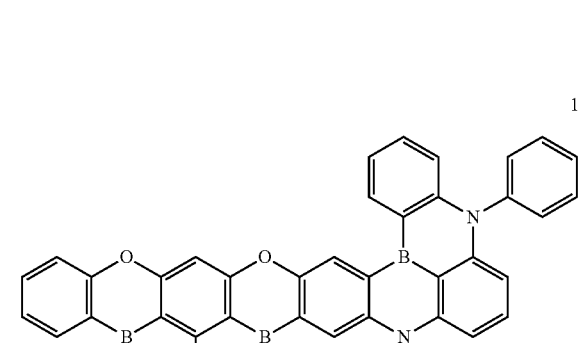
14
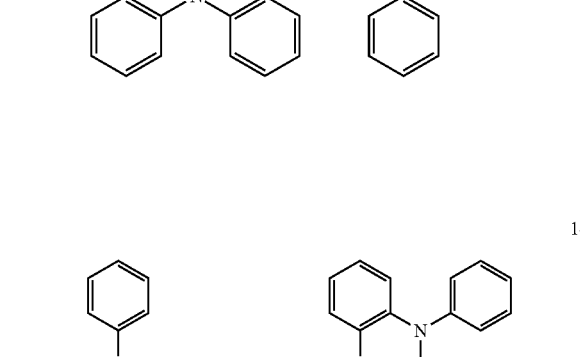
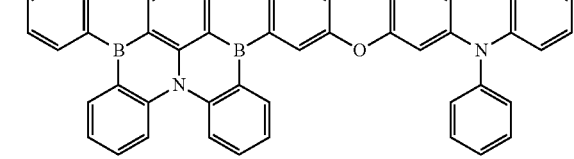

15
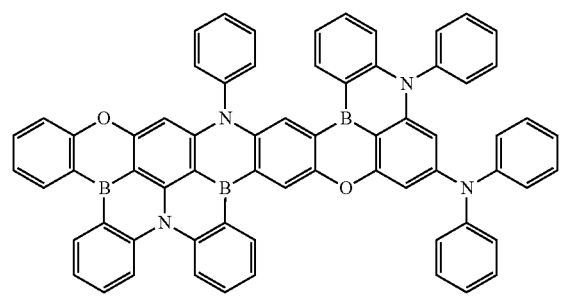
16
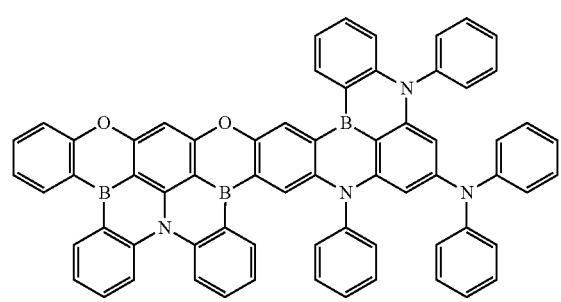
17
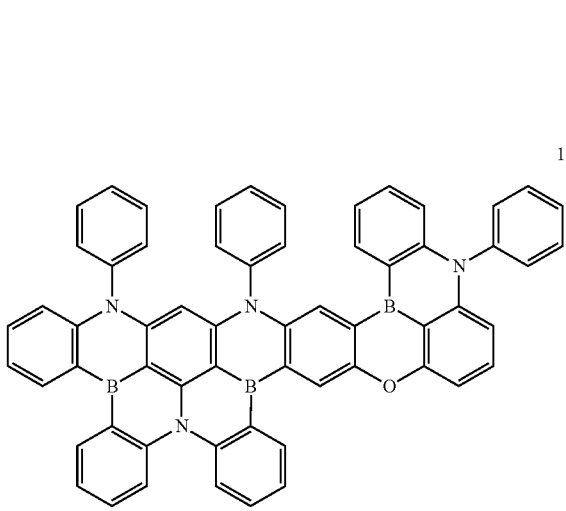
18
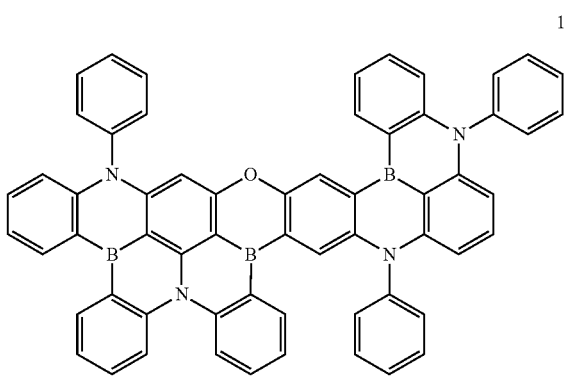
19
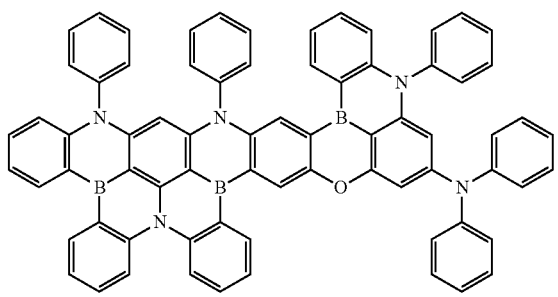
20
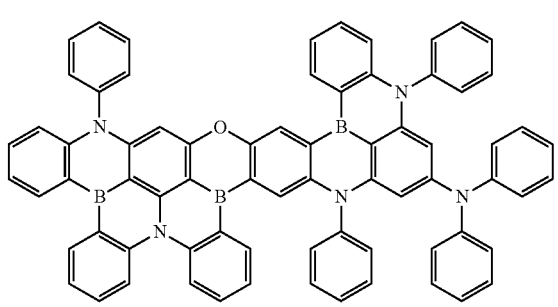
21
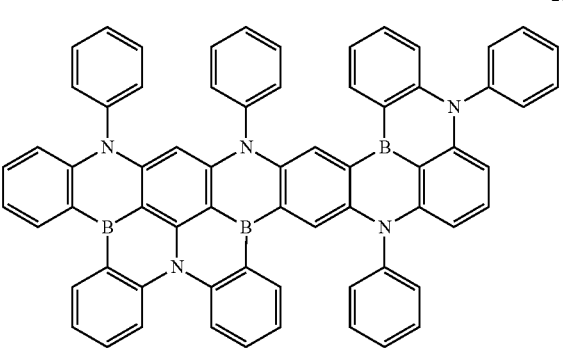
22
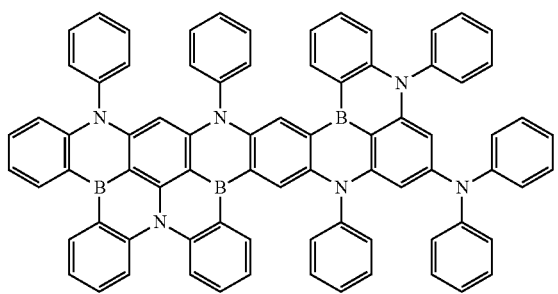

23
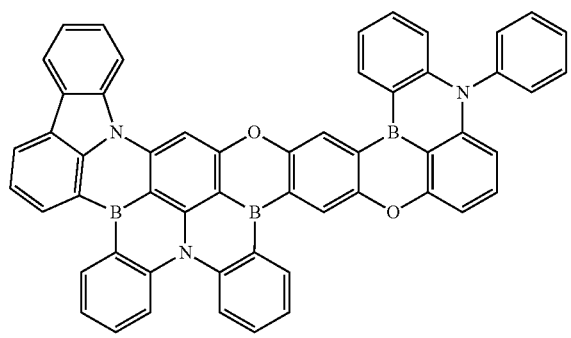
24
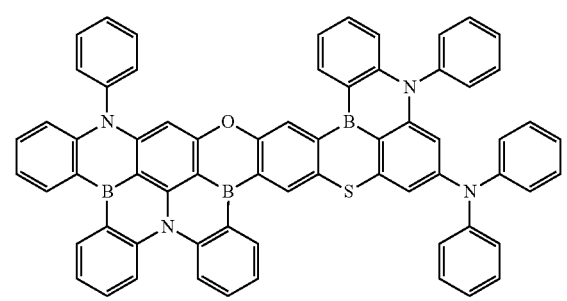
25
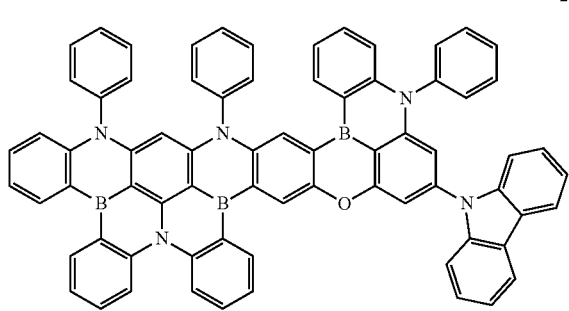
26
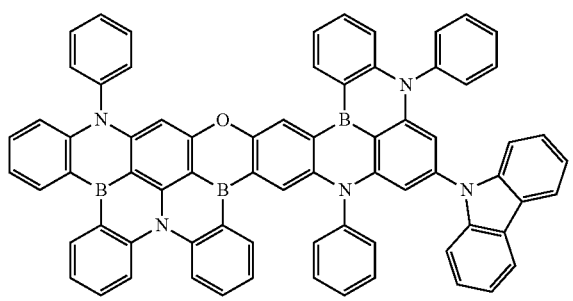
27
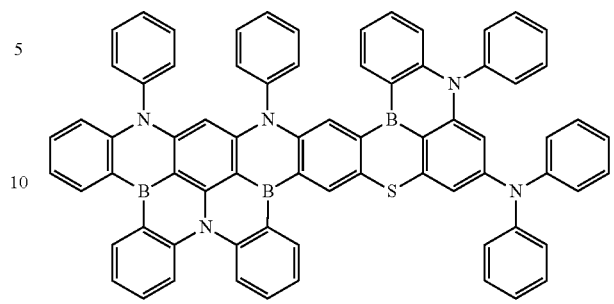
28
29
30

13. A fused polycyclic compound represented by Formula 1 below:

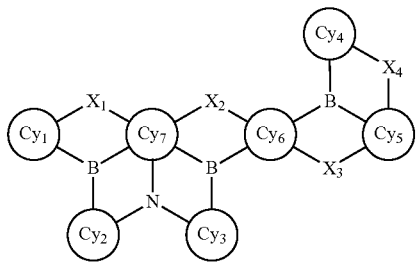

Formula 1 wherein in Formula 1 above,
Cy$_1$ to Cy$_7$ are each independently a substituted or unsubstituted aromatic hydrocarbon ring, or a substituted or unsubstituted aromatic heterocycle,
X$_1$ to X$_4$ are each independently NR$_a$, O, or S, and
R$_a$ is a substituted or unsubstituted alkyl group having 1 to 20 carbon atoms, a substituted or unsubstituted aryl group having 6 to 60 ring-forming carbon atoms, or a substituted or unsubstituted heteroaryl group having 1 to 60 ring-forming carbon atoms.

14. The fused polycyclic compound of claim 13, wherein a difference between the lowest singlet excitation energy level (S1) and the lowest triplet excitation energy level (T1) of the fused polycyclic compound represented by Formula 1 above is an absolute value of 0.33 eV or less.

15. The fused polycyclic compound of claim 13, wherein the fused polycyclic compound represented by Formula 1 above is represented by Formula 2 below:

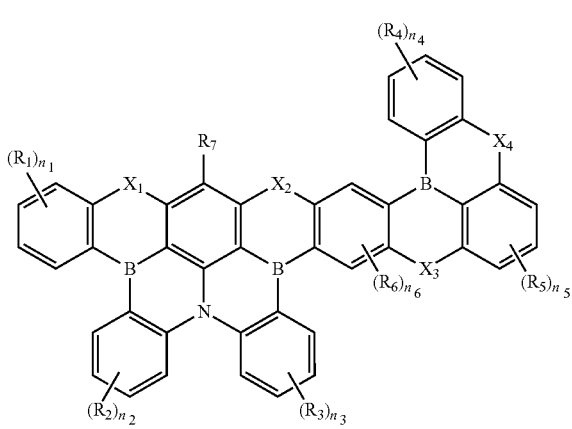

Formula 2 wherein in Formula 2 above,
R$_1$ to R$_7$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group having 1 to 20 carbon atoms, a substituted or unsubstituted aryl group having 6 to ring-forming carbon atoms, a substituted or unsubstituted heteroaryl group having 1 to 60 ring-forming carbon atoms, or bonded to an adjacent group to form a ring, n$_1$ to n$_4$ are each independently an integer of 0 to 4,
n$_5$ is an integer of 0 to 3,
n$_6$ is an integer of 0 to 2, and
X$_1$ to X$_4$ are the same as defined with respect to Formula 1 above.

16. The fused polycyclic compound of claim 15, wherein the fused polycyclic compound represented by Formula 1 above is represented by Formula 3 below:

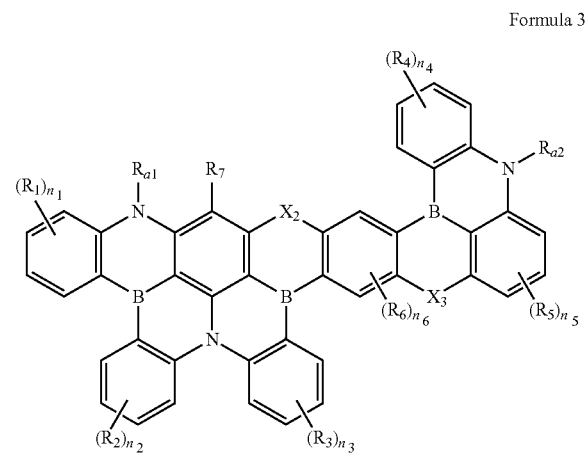

Formula 3 wherein in Formula 3 above,
R$_{a1}$ and R$_{a2}$ are each independently a substituted or unsubstituted aryl group having 6 to 60 ring-forming carbon atoms, or a substituted or unsubstituted heteroaryl group having 1 to 60 ring-forming carbon atoms, and
X$_2$, X$_3$, R$_1$ to R$_7$, and n$_1$ to n$_6$ are the same as defined with respect to Formulas 1 and 2 above.

17. The fused polycyclic compound of claim 15, wherein the fused polycyclic compound represented by Formula 1 above is represented by Formula 4 below:

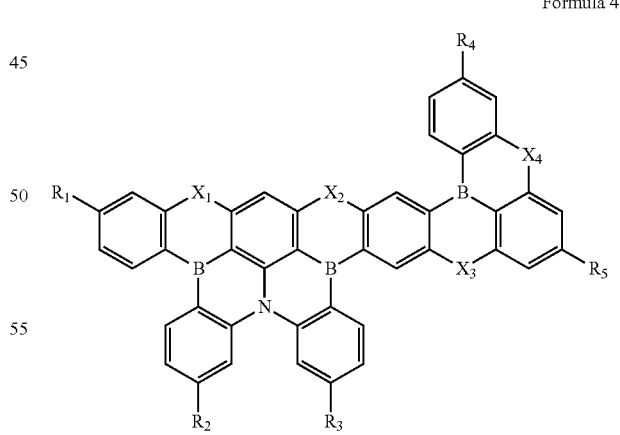

Formula 4 wherein in Formula 4 above,
X$_1$ to X$_4$, R$_1$, to R$_5$ are the same as defined with respect to Formulas 1 and 2 above.

18. The fused polycyclic compound of claim 17, wherein in Formula 4 above, at least one of R$_1$ to R$_5$ is a substituted or unsubstituted amine group, or a substituted or unsubstituted carbazole group.

19. The fused polycyclic compound of claim 13, wherein in Formula 1 above, when $X_1$ to $X_4$ are each independently $NR_a$, $R_a$ is a substituted or unsubstituted phenyl group.
20. The fused polycyclic compound of claim 13, wherein the fused polycyclic compound is at least one of the compounds represented in Compound Group 1 below:
Compound Group 1
1
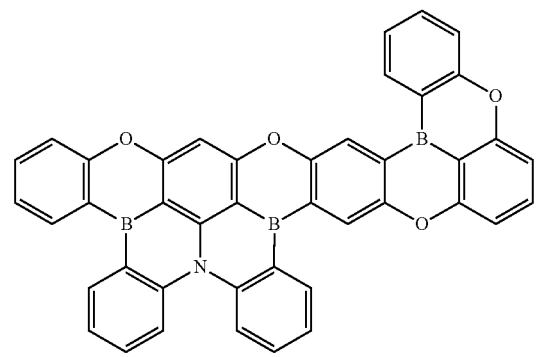
2
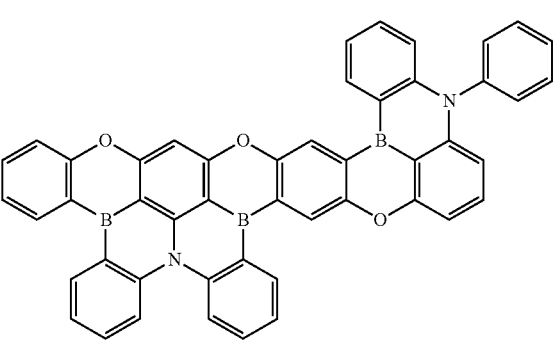
3
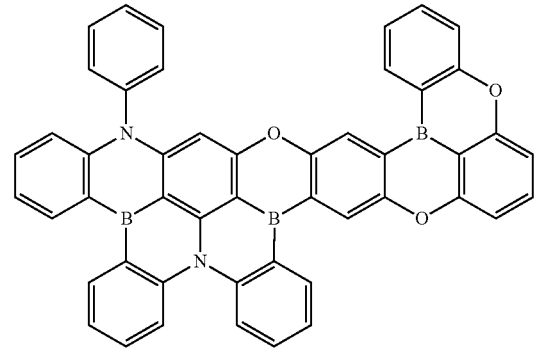
4
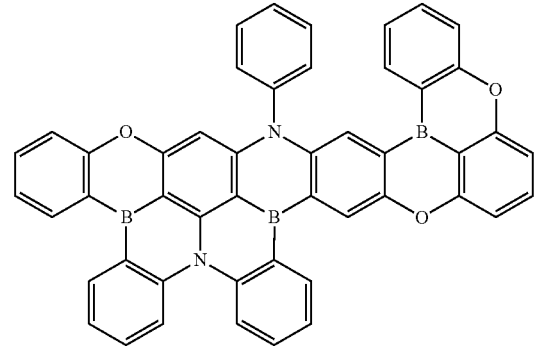
-continued
5
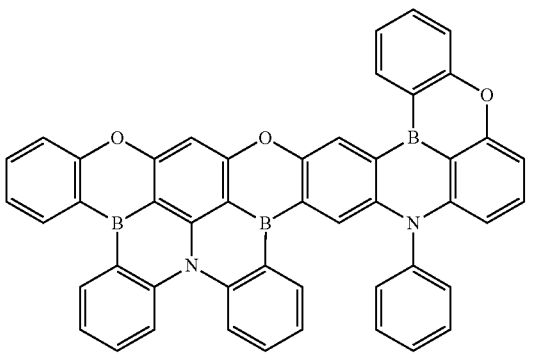
6
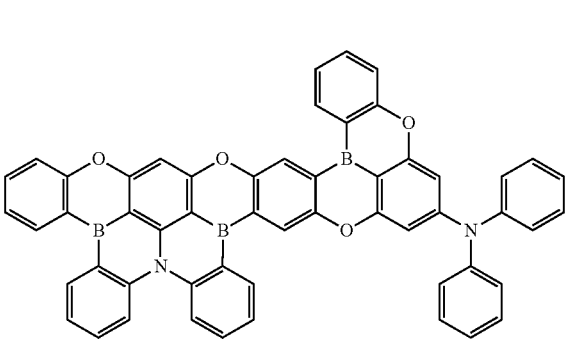
7
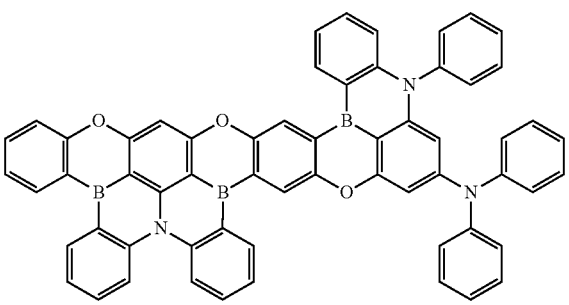
8
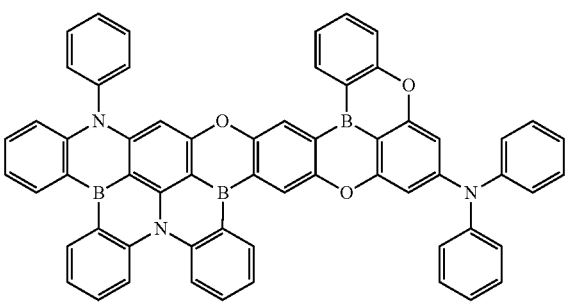
9
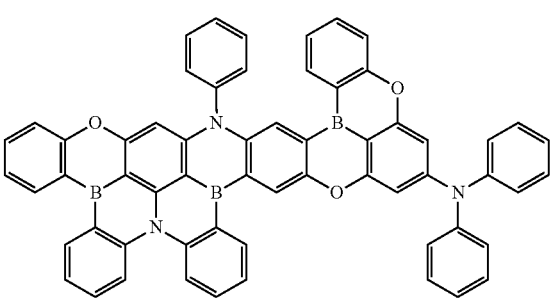

10
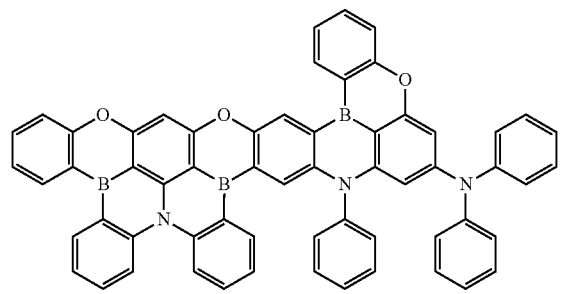
11
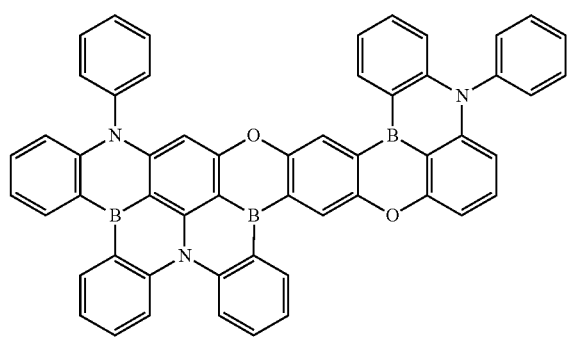
12
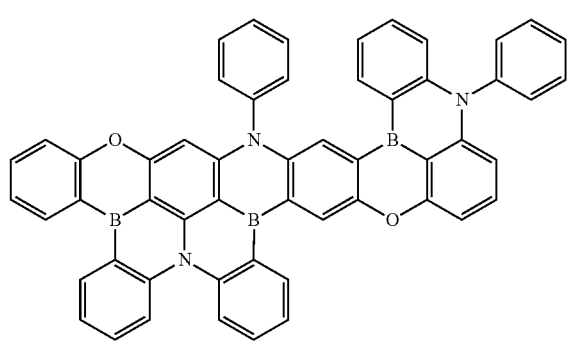
13
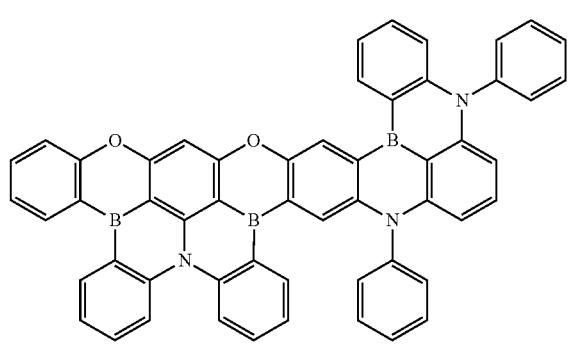
14
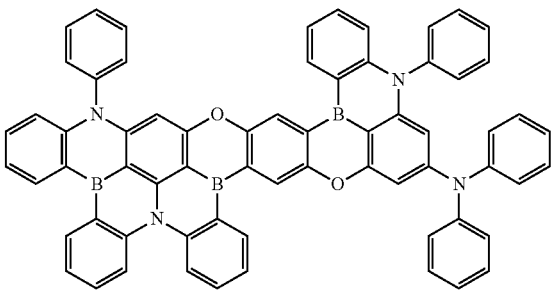
15
16
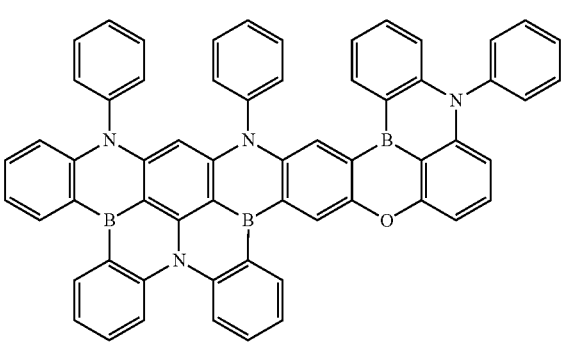
17

18
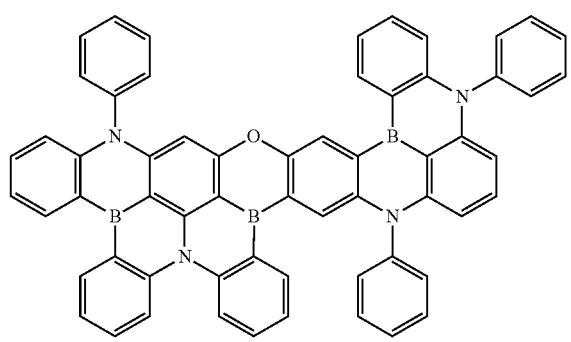
19
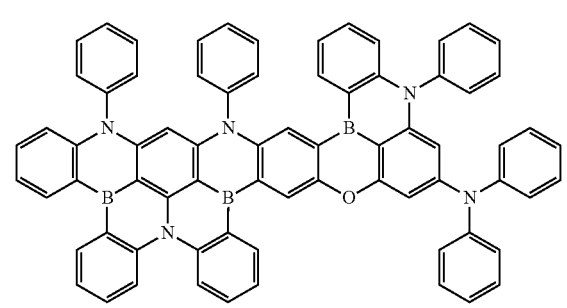
20
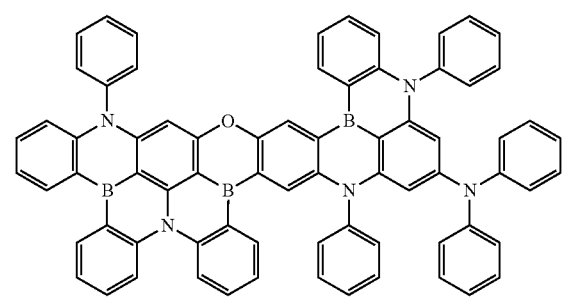
21
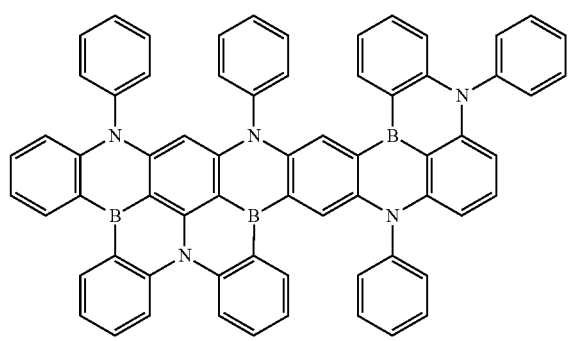
22
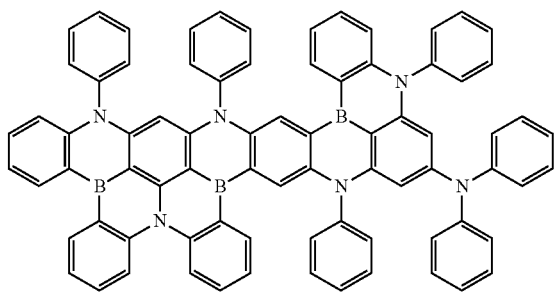
23
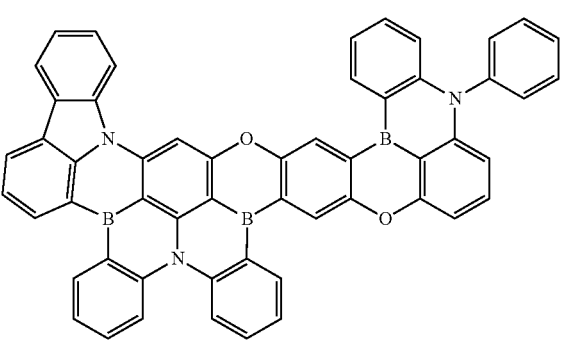
24
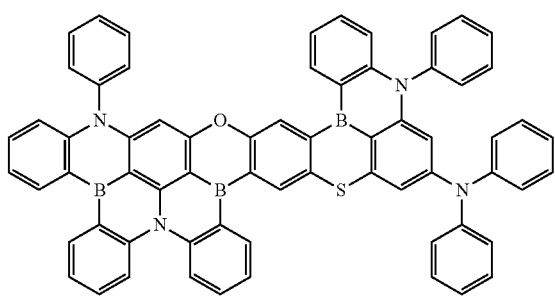
25
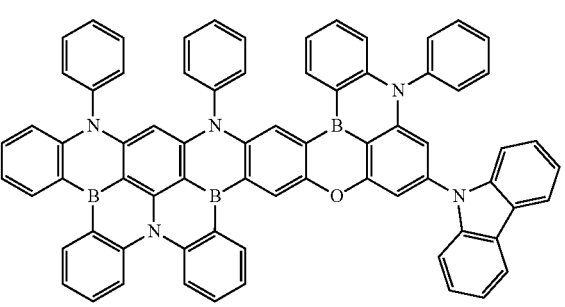
26
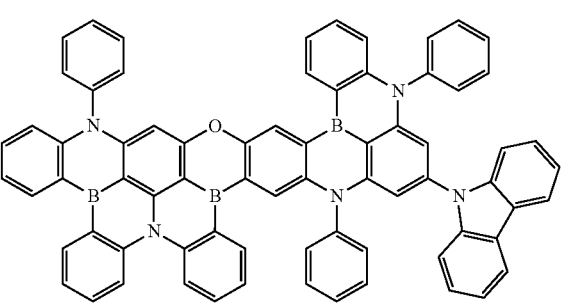

-continued
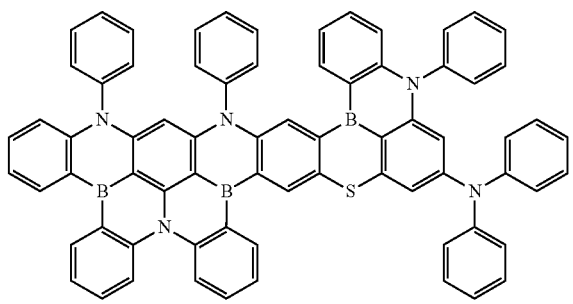
27
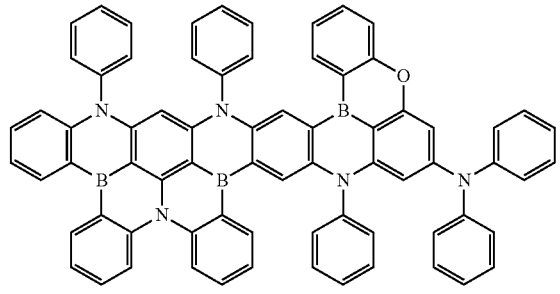
29
28
30
* * * * *